United States Patent
Cho et al.

(10) Patent No.: US 12,471,300 B2
(45) Date of Patent: Nov. 11, 2025

(54) CAPACITOR STRUCTURE, SEMICONDUCTOR MEMORY DEVICE INCLUDING THE STRUCTURE, AND METHOD FOR MANUFACTURING THE STRUCTURE

(71) Applicant: Samsung Electronics Co., Ltd., Suwon-si (KR)

(72) Inventors: Cheol Jin Cho, Suwon-si (KR); Young-Lim Park, Suwon-si (KR); Kyoo Ho Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 464 days.

(21) Appl. No.: 18/107,138

(22) Filed: Feb. 8, 2023

(65) Prior Publication Data

US 2023/0402500 A1    Dec. 14, 2023

(30) Foreign Application Priority Data

Jun. 14, 2022   (KR) ........................ 10-2022-0072260

(51) Int. Cl.
*H10D 1/68*     (2025.01)
*H10B 12/00*    (2023.01)

(52) U.S. Cl.
CPC ........... *H10D 1/696* (2025.01); *H10B 12/315* (2023.02); *H10B 12/482* (2023.02); *H10B 12/488* (2023.02)

(58) Field of Classification Search
CPC .... H10D 1/696; H10B 12/315; H10B 12/482; H10B 12/488
See application file for complete search history.

(56) References Cited

U.S. PATENT DOCUMENTS

| | | |
|---|---|---|
| 8,581,318 B1 | 11/2013 | Chen et al. |
| 8,846,468 B2 | 9/2014 | Rui et al. |
| 8,945,675 B2 | 2/2015 | Pore et al. |
| 10,847,603 B2 | 11/2020 | Moon et al. |

(Continued)

FOREIGN PATENT DOCUMENTS

| | | |
|---|---|---|
| CN | 108511425 A | 9/2018 |
| CN | 113964269 A | 1/2022 |

(Continued)

OTHER PUBLICATIONS

TW First Office Action dated May 31, 2024 for corresponding application No. TW 112118522.

(Continued)

*Primary Examiner* — Samuel A Gebremariam
(74) *Attorney, Agent, or Firm* — Muir Patent Law, PLLC

(57) ABSTRACT

A capacitor structure includes lower and electrodes, and a capacitor dielectric film interposed therebetween. The lower electrode includes a lower electrode film including a first metal element, a first doped oxide film including a second metal element and an oxide of the first metal element, and a first metal oxide film. The first metal oxide film includes an oxide of the first metal element and is free of the second metal element. The upper electrode includes an upper electrode film including the first metal element, a second doped oxide film including the second metal element and an oxide of the first metal element, and a second metal oxide film that includes an oxide of the first metal element, and is free of the second metal element.

20 Claims, 33 Drawing Sheets

(56) References Cited

U.S. PATENT DOCUMENTS

| | | |
|---|---|---|
| 10,964,614 B2 | 3/2021 | Lee et al. |
| 11,004,612 B2 | 5/2021 | Chen et al. |
| 2012/0273921 A1 | 11/2012 | Do et al. |
| 2016/0099304 A1 | 4/2016 | Mathur |
| 2019/0267383 A1 | 8/2019 | Rocklein et al. |
| 2022/0093603 A1 | 3/2022 | Cho et al. |
| 2022/0173209 A1 | 6/2022 | Lee et al. |

FOREIGN PATENT DOCUMENTS

| | | |
|---|---|---|
| CN | 111952288 B | 7/2022 |
| EP | 1473759 A2 | 11/2004 |
| TW | 201106397 A | 2/2011 |

OTHER PUBLICATIONS

European Search Report dated Oct. 26, 2023 for corresponding to European Patent application EP 23 164 904.7.

40

40

40

CAPACITOR STRUCTURE, SEMICONDUCTOR MEMORY DEVICE INCLUDING THE STRUCTURE, AND METHOD FOR MANUFACTURING THE STRUCTURE

CROSS-REFERENCE TO RELATED APPLICATION

This application claims priority from Korean Patent Application No. 10-2022-0072260 filed on Jun. 14, 2022, in the Korean Intellectual Property Office, and all the benefits accruing therefrom under 35 U.S.C. 119, the contents of which in its entirety are herein incorporated by reference.

BACKGROUND

Field

The present disclosure relates to a capacitor structure, a semiconductor memory device including the structure, and a method for manufacturing the structure.

Description of Related Art

Recently, as a semiconductor device has large-capacity and become highly integrated, a design rule is also continuously decreasing. This trend is applied to a dynamic random access memory (DRAM) device as one of memory semiconductor devices. In order for the DRAM device to operate, a capacitor having a certain capacitance or greater is desirable in each cell.

In order to increase the capacitance, a scheme of using a dielectric film having a high dielectric constant in the capacitor or doping an electrode of the capacitor with a metal material is being studied.

SUMMARY

A technical purpose to be achieved by the present disclosure is to provide a capacitor structure with improved capacitance and reduced stress.

A technical purpose to be achieved by the present disclosure is to provide a semiconductor memory device having improved capacitance and reduced stress.

A technical purpose to be achieved by the present disclosure is to provide a method for manufacturing a capacitor structure with improved capacitance and reduced stress.

According to some aspects of the present inventive concept, there is provided a capacitor structure comprising a lower electrode, an upper electrode and a capacitor dielectric film interposed between the lower electrode and the upper electrode, wherein the lower electrode includes a lower electrode film including a first metal element, a first doped oxide film disposed between the lower electrode film and the capacitor dielectric film, wherein the first doped oxide film includes a second metal element and an oxide of the first metal element, wherein the second metal element includes at least one of Group 5 to Group 11 and Group 15 metal elements and a first metal oxide film disposed between the lower electrode film and the first doped oxide film, wherein the first metal oxide film includes an oxide of the first metal element and is free of the second metal element, wherein the upper electrode includes an upper electrode film including the first metal element a second doped oxide film disposed between the upper electrode film and the capacitor dielectric film, wherein the second doped oxide film includes the second metal element and an oxide of the first metal element and a second metal oxide film disposed between the capacitor dielectric film and the second doped oxide film, wherein the second metal oxide film includes an oxide of the first metal element, and is free of the second metal element.

According to some aspects of the present inventive concept, there is provided a capacitor structure comprising a lower electrode, an upper electrode and a capacitor dielectric film interposed between the lower electrode and the upper electrode, wherein the lower electrode includes a lower electrode film including a first metal element and a first doped oxide film disposed between the lower electrode film and the capacitor dielectric film, wherein the first doped oxide film includes a second metal element and an oxide of the first metal element, wherein the second metal element includes at least one of Group 5 to Group 11 and Group 15 metal elements, wherein the upper electrode includes an upper electrode film including the first metal element and a second doped oxide film disposed between the upper electrode film and the capacitor dielectric film, wherein the second doped oxide film includes a third metal element and an oxide of the first metal element, wherein the third metal element includes at least one of Group 5 to Group 11 and Group 15 metal elements, wherein the capacitor dielectric film includes a first zirconium oxide film, a second zirconium oxide film, and a first hafnium oxide film disposed between the first zirconium oxide film and the second zirconium oxide film.

According to some aspects of the present inventive concept, there is provided a semiconductor memory device comprising a substrate including an active area, a bit-line disposed on the substrate, and extending in a first direction, wherein the bit-line is connected to the active area, a capacitor contact disposed on the substrate, wherein the capacitor contact is spaced from the bit-line and is connected to the active area, a word-line disposed on the active area and between the bit-line and the capacitor contact, wherein the word-line extends in a second direction intersecting the first direction and a capacitor structure including a lower electrode, a capacitor dielectric film and an upper electrode sequentially stacked on the lower electrode, wherein the lower electrode is connected to the capacitor contact, wherein the lower electrode includes a lower electrode film including a first metal element, a first doped oxide film disposed between the lower electrode film and the capacitor dielectric film, wherein the first doped oxide film includes a second metal element and an oxide of the first metal element, wherein the second metal element includes at least one of Group 5 to Group 11 and Group 15 metal elements and a first metal oxide film disposed between the lower electrode film and the first doped oxide film, wherein the first metal oxide film includes an oxide of the first metal element and is free of the second metal element, wherein the upper electrode includes an upper electrode film including the first metal element, a second doped oxide film disposed between the upper electrode film and the capacitor dielectric film, wherein the second doped oxide film includes a third metal element and an oxide of the first metal element, wherein the third metal element includes at least one of Group 5 to Group 11 and Group 15 metal elements and a second metal oxide film disposed between the capacitor dielectric film and the second doped oxide film, wherein the second metal oxide film includes an oxide of the first metal element and is free of the third metal element, wherein the capacitor dielectric film includes a first zirconium oxide film, a second zirconium oxide film, and a hafnium oxide film disposed between the first zirconium oxide film and the second zirconium oxide film.

According to some aspects of the present inventive concept, there is provided a method for manufacturing a capacitor structure, the method comprising providing a substrate, forming a lower electrode film on the substrate, wherein the lower electrode film includes a first metal element, forming a first metal oxide film on the lower electrode film, wherein the first metal oxide film includes an oxide of the first metal element, forming a blocking film on the first metal oxide film, wherein the blocking film includes silicon oxide, forming a first dopant film on the blocking film, wherein the first dopant film includes a second metal element including at least one of Group 5 to Group 11 and Group 15 metal elements, performing a heat treatment process on the first dopant film such that the second metal element diffuses through the blocking film into the first metal oxide film, thereby forming a first doped oxide film including the oxide of the first metal element doped with the second metal element, removing the blocking film, forming a capacitor dielectric film on the first doped oxide film, wherein the capacitor dielectric film includes a first zirconium oxide film, a hafnium oxide film and a second zirconium oxide film sequentially stacked on the first doped oxide film, forming a second metal oxide film on the capacitor dielectric film, wherein the second metal oxide film includes the first metal element, forming a second dopant film on the second metal oxide film, wherein the second dopant film includes the second metal element, performing a heat treatment process on the second dopant film such that the second metal element diffuses into the second metal oxide film, thereby forming a second doped oxide film including an oxide of the first metal element doped with the second metal element and forming an upper electrode film on the second doped oxide film, wherein the upper electrode film includes the first metal element.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTIONS

Figure 1:
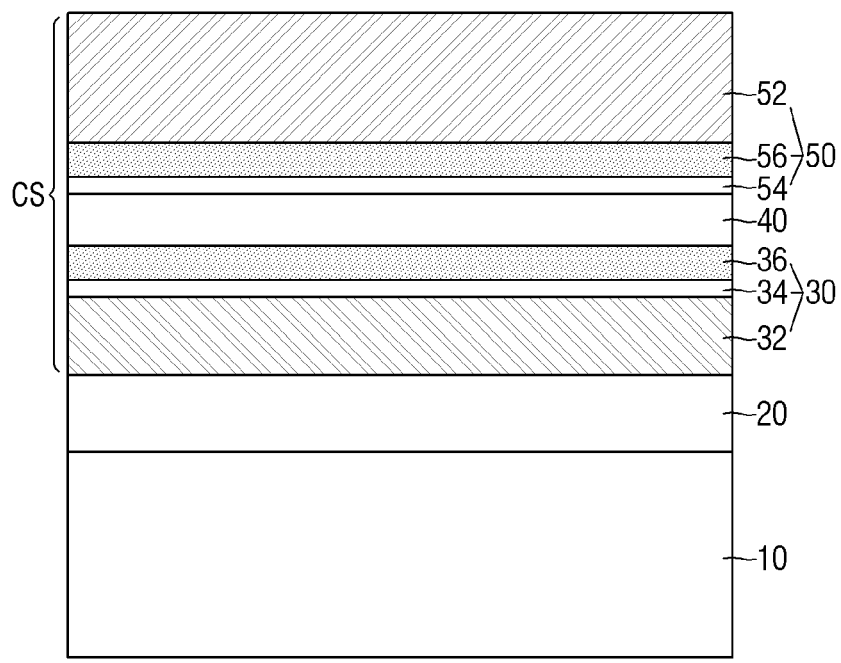
FIG. 1 is an illustrative cross-sectional view for illustrating a capacitor structure according to some embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the idea and scope of the present disclosure as defined by the appended claims.

A shape, a size, a ratio, an angle, a number, etc. disclosed in the drawings for illustrating embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer, or section. Thus, a first element, component, region, layer, or section described below could be termed a second element, component, region, layer, or section, without departing from the idea and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Hereinafter, embodiments according to the technical idea of the present disclosure will be described with reference to the accompanying drawings.

FIG. 1 is an illustrative cross-sectional view for illustrating a capacitor structure according to some embodiments. FIG. 2 to FIG. 7 is an illustrative cross-sectional view for illustrating a capacitor dielectric film of a capacitor structure according to some embodiments.

Referring to FIG. 1, a capacitor structure CS according to some embodiments is formed on a substrate 10 and a lower insulating film 20.

The substrate 10 may include or may be made of a bulk silicon or (SOI) silicon-on-insulator. In some embodiments, the substrate 10 may be a silicon substrate, or may be made of a material other than silicon, such as silicon germanium, SGOI (silicon germanium on insulator), indium antimonide, lead telluride compound, indium arsenide, indium phosphide, gallium arsenide, and gallium antimonide, but may not limited thereto. In some embodiments, the substrate 100 may include or may be formed of a base substrate and an epitaxial layer formed on the base substrate.

The lower insulating film 20 may be formed on the substrate 10. The lower insulating film 20 may include or may be formed of, for example, at least one of silicon oxide, silicon nitride, silicon oxynitride, and a low dielectric constant (low-k) material having a dielectric constant smaller than that of silicon oxide. The low dielectric constant material may include or may be formed of, for example, at least one of FOX (Flowable Oxide), TOSZ (Torene Silazene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, a porous polymeric material, and a combination thereof. The present disclosure is not limited thereto.

The capacitor structure CS includes a lower electrode 30, a capacitor dielectric film 40 and an upper electrode 50. The lower electrode 30, the capacitor dielectric film 40, and the upper electrode 50 may be sequentially stacked on the substrate 10 and the lower insulating film 20. The capacitor structure CS may store electric charges in the capacitor dielectric film 40 using a potential difference between potentials of the lower electrode 30 and the upper electrode 50.

The lower electrode 30 may include a lower electrode film 32, a first metal oxide film 34 and a first doped oxide film 36. The lower electrode film 32, the first metal oxide film 34, and the first doped oxide film 36 may be sequentially stacked on the substrate 10 and the lower insulating film 20.

The lower electrode film 32 may include or may be formed of a first metal element. The first metal element may include, for example, at least one of titanium (Ti), tantalum (Ta), tungsten (W), and ruthenium (Ru). However, the present disclosure is not limited thereto. In some embodiments, the lower electrode film 32 may include or may be formed of a nitride of the first metal element. In one example, the lower electrode film 32 may include or may be formed of titanium nitride.

The first metal oxide film 34 may be formed on the lower electrode film 32. The first metal oxide film 34 may be interposed between the lower electrode film 32 and the first doped oxide film 36. The first metal oxide film 34 may include or may be formed of an oxide of the first metal element. In one example, when the first metal element may be titanium (Ti), the first metal oxide film 34 may include or may be formed of titanium oxide. The first metal oxide film 34 may be formed using an oxidation process of the lower electrode film 32. However, the present disclosure is not limited thereto. In some embodiments, the first metal oxide film 34 may be a natural oxide film of the lower electrode film 32.

The first doped oxide film 36 may be formed on the first metal oxide film 34. The first doped oxide film 36 may be interposed between the first metal oxide film 34 and the capacitor dielectric film 40. The first doped oxide film 36 may include or may be formed of an oxide of the first metal element doped with a second metal element. In one example, the first doped oxide film 36 may include or may be formed of titanium oxide doped with the second metal element. The first doped oxide film 36 may be formed using a doping process of the second metal element into the oxide of the first metal element. For example, the first doped oxide film 36 may include an or may be formed of oxide of the first metal element doped with 0.01 atomic % or greater of the second metal element. A thickness of the first metal oxide film 34 may be smaller than a thickness of the first doped oxide film 36.

In some embodiments, the second metal element may include or may be a metal element selected from at least one of Group 5 to Group 11 and Group 15 metal elements. For example, the second metal element may include or may be a metal element selected from at least one of antimony (Sb), molybdenum (Mo), cobalt (Co), niobium (Nb), copper (Cu), nickel (Ni), tantalum (Ta), vanadium (V), and tungsten (W). However, the present disclosure is not limited thereto.

The first doped oxide film 36 may further contain an impurity element. For example, the impurity element may include or may be at least one of silicon (Si), aluminum (Al), zirconium (Zr), and hafnium (Hf). The first doped oxide film 36 may include or may be formed of titanium oxide doped with the second metal element and silicon (Si). The impurity element of the first doped oxide film 36 may prevent the lower electrode film 32 or the first metal oxide film 34 from being excessively oxidized in the process of doping the second metal element, thereby reducing stress applied to the capacitor structure CS. This will be described later in more detail in descriptions of FIG. 20 to FIG. 33.

The capacitor dielectric film 40 may be formed on the lower electrode 30. The capacitor dielectric film 40 may be interposed between the lower electrode 30 and the upper electrode 50. A thickness of capacitor dielectric film 40 may be in a range of 30 to 60 Å.

The capacitor dielectric film 40 may include or may be formed of, for example, at least one of silicon oxide, silicon nitride, silicon oxynitride, and a high-k material having a higher dielectric constant than that of silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof. The present disclosure is not limited thereto. In some embodiments, the capacitor dielectric film 40 may include or may be formed of at least one of aluminum oxide, zirconium oxide, and hafnium oxide.

Figure 2:
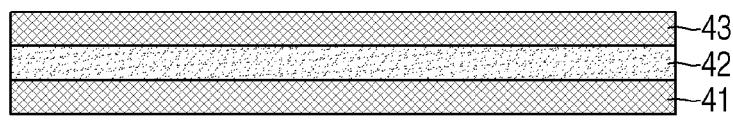
FIG. 2 to FIG. 7 is an illustrative cross-sectional view for illustrating a capacitor dielectric film of a capacitor structure according to some embodiments.

For example, referring to FIG. 2, the capacitor dielectric film 40 may include a first zirconium oxide film 41, a hafnium oxide film 42, and a second zirconium oxide film 43 sequentially stacked on the lower electrode 30. Each of the first zirconium oxide film 41 and the second zirconium oxide film 43 may include or may be formed of zirconium oxide ($ZrO_2$). The hafnium oxide film 42 may include or may be formed of hafnium oxide ($HfO_2$).

The first zirconium oxide film 41 may be disposed between the lower electrode 30 and the hafnium oxide film 42. The first zirconium oxide film 41 may be disposed on the first doped oxide film 36. The second zirconium oxide film 43 may be disposed between the hafnium oxide film 42 and the upper electrode 50. The second zirconium oxide film 43 may be disposed under the second metal oxide film 54.

The hafnium oxide film 42 may be disposed between the first zirconium oxide film 41 and the second zirconium oxide film 43. A thickness of hafnium oxide film 42 may be smaller than or equal to 20 Å. The hafnium oxide film 42 may be disposed between the first zirconium oxide film 41 and the second zirconium oxide film 43, thereby increasing a dielectric constant of the capacitor dielectric film 40.

Figure 3:
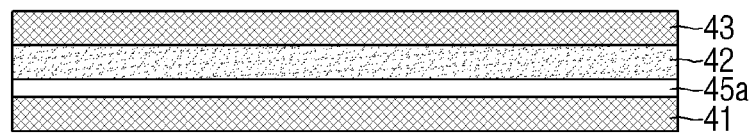

In an example, referring to FIG. 3, the capacitor dielectric film 40 may include the first zirconium oxide film 41, a first aluminum oxide film 45a, the hafnium oxide film 42 and the second zirconium oxide film 43 sequentially stacked on the lower electrode 30. In this regard, the hafnium oxide film 42 is disposed between the first zirconium oxide film 41 and the second zirconium oxide film 43. The hafnium oxide film 42 may be disposed between the second zirconium oxide film 43 and the first aluminum oxide film 45a.

The first aluminum oxide film 45a may include or may be formed of aluminum oxide ($Al_2O_3$). The first aluminum oxide film 45a may be disposed in the capacitor dielectric film 40 as a stack structure in which the first zirconium oxide film 41, the hafnium oxide film 42 and the second zirconium oxide film 43 are sequentially stacked, such that crystallinity of the capacitor dielectric film 40 may be enhanced.

Figure 4:
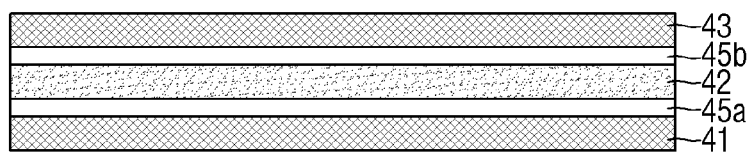

In an example, referring to FIG. 4, the capacitor dielectric film 40 may include the first zirconium oxide film 41, the first aluminum oxide film 45*a*, the hafnium oxide film 42, a second aluminum oxide film 45*b* and the second zirconium oxide film 43 sequentially stacked on the lower electrode 30. In this regard, the hafnium oxide film 42 is disposed between the first zirconium oxide film 41 and the second zirconium oxide film 43. The hafnium oxide film 42 may be disposed between the first aluminum oxide film 45*a* and the second aluminum oxide film 45*b*.

Figure 5:
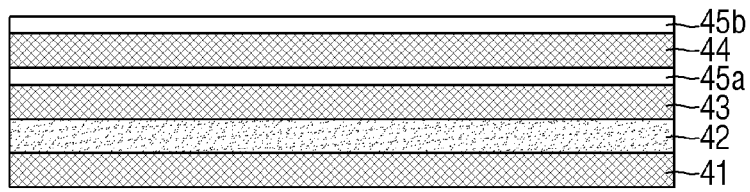

In an example, referring to FIG. 5, the capacitor dielectric film 40 may include the first zirconium oxide film 41, the hafnium oxide film 42, the second zirconium oxide film 43, the first aluminum oxide film 45*a*, a third zirconium oxide film 44 and the second aluminum oxide film 45*b* sequentially stacked on the lower electrode 30. In this regard, the hafnium oxide film 42 is disposed between the first zirconium oxide film 41 and the second zirconium oxide film 43.

The first aluminum oxide film 45*a* and the second aluminum oxide film 45*b* may be disposed between the second zirconium oxide film 43 and the upper electrode 50. The second aluminum oxide film 45*b* may be disposed between the third zirconium oxide film 44 and the upper electrode 50.

Figure 6:
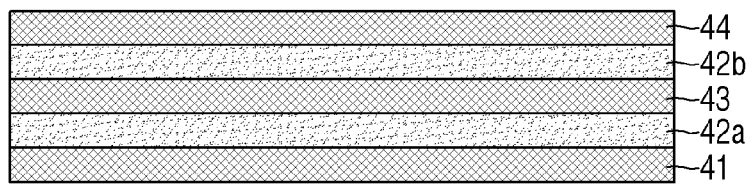

In an example, referring to FIG. 6, the capacitor dielectric film 40 may include the first zirconium oxide film 41, a first hafnium oxide film 42*a*, the second zirconium oxide film 43, a second hafnium oxide film 42*b*, and a third zirconium oxide film 44 sequentially stacked on the lower electrode 30.

The first hafnium oxide film 42*a* may be disposed between the first zirconium oxide film 41 and the second zirconium oxide film 43. The second hafnium oxide film 42*b* may be disposed between the second zirconium oxide film 43 and the third zirconium oxide film 44. A thickness of each of the first hafnium oxide film 42*a* and the second hafnium oxide film 42*b* may be 20 Å or smaller.

Figure 7:
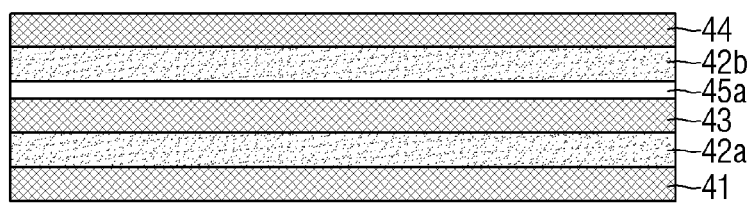

In an example, referring to FIG. 7, the capacitor dielectric film 40 may include the first zirconium oxide film 41, the first hafnium oxide film 42*a*, the second zirconium oxide film 43, the first aluminum oxide film 45*a*, the second hafnium oxide film 42*b* and the third zirconium oxide film 44 sequentially stacked on the lower electrode 30.

The first aluminum oxide film 45*a* may be disposed between the second zirconium oxide film 43 and the upper electrode 50.

Referring back to FIG. 1, the upper electrode 50 may be formed on the capacitor dielectric film 40.

The upper electrode 50 may include a second metal oxide film 54, a second doped oxide film 56, and an upper electrode film 52. The second metal oxide film 54, the second doped oxide film 56, and the upper electrode film 52 may be sequentially stacked on the capacitor dielectric film 40.

The second metal oxide film 54 may be formed on the capacitor dielectric film 40. The second metal oxide film 54 may be interposed between the capacitor dielectric film 40 and the second doped oxide film 56. The second metal oxide film 54 may include or may be formed of the oxide of the first metal element. In one example, when the first metal element is titanium (Ti), the first metal oxide film 34 may include titanium oxide. The second metal oxide film 54 may be formed on the capacitor dielectric film 40 using a deposition process. However, the present disclosure is not limited thereto. A description of the second metal oxide film 54 may be substantially the same as the description of the first metal oxide film 34.

The second doped oxide film 56 may be formed on the second metal oxide film 54. The second doped oxide film 56 may be interposed between the second metal oxide film 54 and the upper electrode film 52. The second doped oxide film 56 may include or may be formed of an oxide of the first metal element doped with the third metal element. In one example, the second doped oxide film 56 may include or may be formed of titanium oxide doped with a third metal element. The second doped oxide film 56 may be formed using a doping process of the third metal element into the oxide of the first metal element. For example, the second doped oxide film 56 may include or may be formed of an oxide of the first metal element doped with the third metal element at 0.01 atomic % or greater. A thickness of the second metal oxide film 54 may be smaller than a thickness of the second doped oxide film 56.

In some embodiments, the third metal element may include or may be a metal element selected from at least one of Group 5 to Group 11 and Group 15 metal elements. For example, the third metal element may include or may be a metal element selected from at least one of antimony (Sb), molybdenum (Mo), cobalt (Co), niobium (Nb), copper (Cu), nickel (Ni), tantalum (Ta), vanadium (V), and tungsten (W). However, the present disclosure is not limited thereto.

The second metal element included in the first doped oxide film 36 and the third metal element included in the second doped oxide film 56 may be identical with each other. For example, each of the second metal element included in the first doped oxide film 36 and the third metal element included in the second doped oxide film 56 may be niobium (Nb).

That is, when the first doped oxide film 36 includes or is formed of the oxide of the first metal element doped with niobium (Nb), the second doped oxide film 56 may include or may be formed of the oxide of the first metal element doped with niobium (Nb). Unlike the first doped oxide film 36, the second doped oxide film 56 may be free of the impurity element. In some embodiments, while the first doped oxide film 36 contains silicon (Si), the second doped oxide film 56 may not contain silicon (Si).

The upper electrode film 52 may be formed on the second doped oxide film 56. The upper electrode film 52 may include or may be formed of the first metal element. In some embodiments, the lower electrode film 32 may include or may be formed of a nitride of the first metal element. For example, the lower electrode film 32 may include or may be formed of titanium nitride.

The upper electrode film 52 may include or may be formed of the same first metal element as that of the lower electrode film 32. However, an embodiment is not limited thereto. For example, the upper electrode film 52 may include or may be formed of a metal element different from the first metal element that the lower electrode film 32 includes. A description of the upper electrode film 52 may be substantially the same as the description of the lower electrode film 32.

The capacitor structure CS according to some embodiments include the first doped oxide film 36 and thus has an improved capacitance. For example, a depletion area is generated in the first metal oxide film 34 including the titanium oxide, etc. when a voltage (e.g., a negative voltage) is applied to the lower electrode 30, thereby lowering the capacitance of the capacitor structure CS. However, as described above, the first doped oxide film 36 is interposed between the first metal oxide film 34 and the capacitor dielectric film 40, thereby reducing the generation of the depletion area in the first metal oxide film 34. Further, as described above, the first doped oxide film 36 may include or may be formed of at least one of the group 5 to group 11 and group 15 metal elements. Thus, the capacitor dielectric film 40 formed on the first doped oxide film 36 may include or may be formed of both a tetragonal crystal structure and an orthorhombic crystal structure and thus may have an improved dielectric constant. Accordingly, the capacitor structure CS having an improved capacitance may be formed.

In the capacitor structure CS according to some embodiments, the first doped oxide film 36 may contain the impurity element to minimize the formation of the first metal oxide film 34 so as to reduce stress. For example, the lower electrode film 32 or the first metal oxide film 34 may be excessively oxidized in the process of doping the second metal element to form an oxide film of an excessive thickness. This causes an increase in the stress applied to the capacitor structure CS. However, as described above, the impurity element of the first doped oxide film 36 may prevent the first metal oxide film 34 from being excessively oxidized while the second metal element is doped. Accordingly, the capacitor structure CS with the reduced stress may be provided.

The capacitor structure CS according to some embodiments may include the second metal oxide film 54 and the second doped oxide film 56 to control leakage current. Specifically, conduction band minimum (CBM) may increase due to the second metal oxide film 54 and the second doped oxide film 56 between the upper electrode film 52 and the capacitor dielectric film 40. Accordingly, the second metal oxide film 54 and the second doped oxide film 56 of the capacitor structure CS may control the leakage current between the upper electrode film 52 and the capacitor dielectric film 40.

Figure 8:
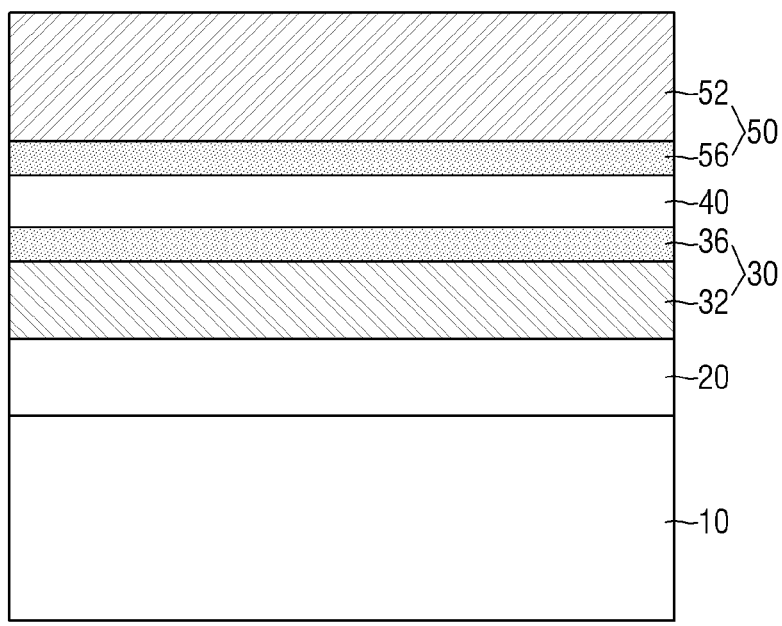
FIG. 8 is an illustrative cross-sectional view for illustrating a capacitor structure according to some embodiments.

FIG. 8 is an illustrative cross-sectional view for illustrating a capacitor structure according to some embodiments. For convenience of description, following description is based on differences thereof from the descriptions as set forth with reference to FIG. 1.

Referring to FIG. 8, in the capacitor structure CS according to some embodiments, the lower electrode 30 includes the lower electrode film 32 and the first doped oxide film 36. The upper electrode 50 includes the upper electrode film 52 and the second doped oxide film 56.

The lower electrode 30 may not include the first metal oxide film 34 as described above using FIG. 1. For example, the first doped oxide film 36 may be formed directly on the lower electrode film 32. The upper electrode 50 may not include the second metal oxide film 54 as described above using FIG. 1. For example, the second doped oxide film 56 may be formed directly on the capacitor dielectric film 40.

The capacitor structure CS is similar to that as described above using FIG. 1 except that the first metal oxide film 34 is not interposed between the lower electrode film 32 and the first doped oxide film 36, and that the second metal oxide film 54 is not interposed between the capacitor dielectric film 40 and the second doped oxide film 56. Thus, detailed descriptions of the similar components will be omitted below.

Figure 9:
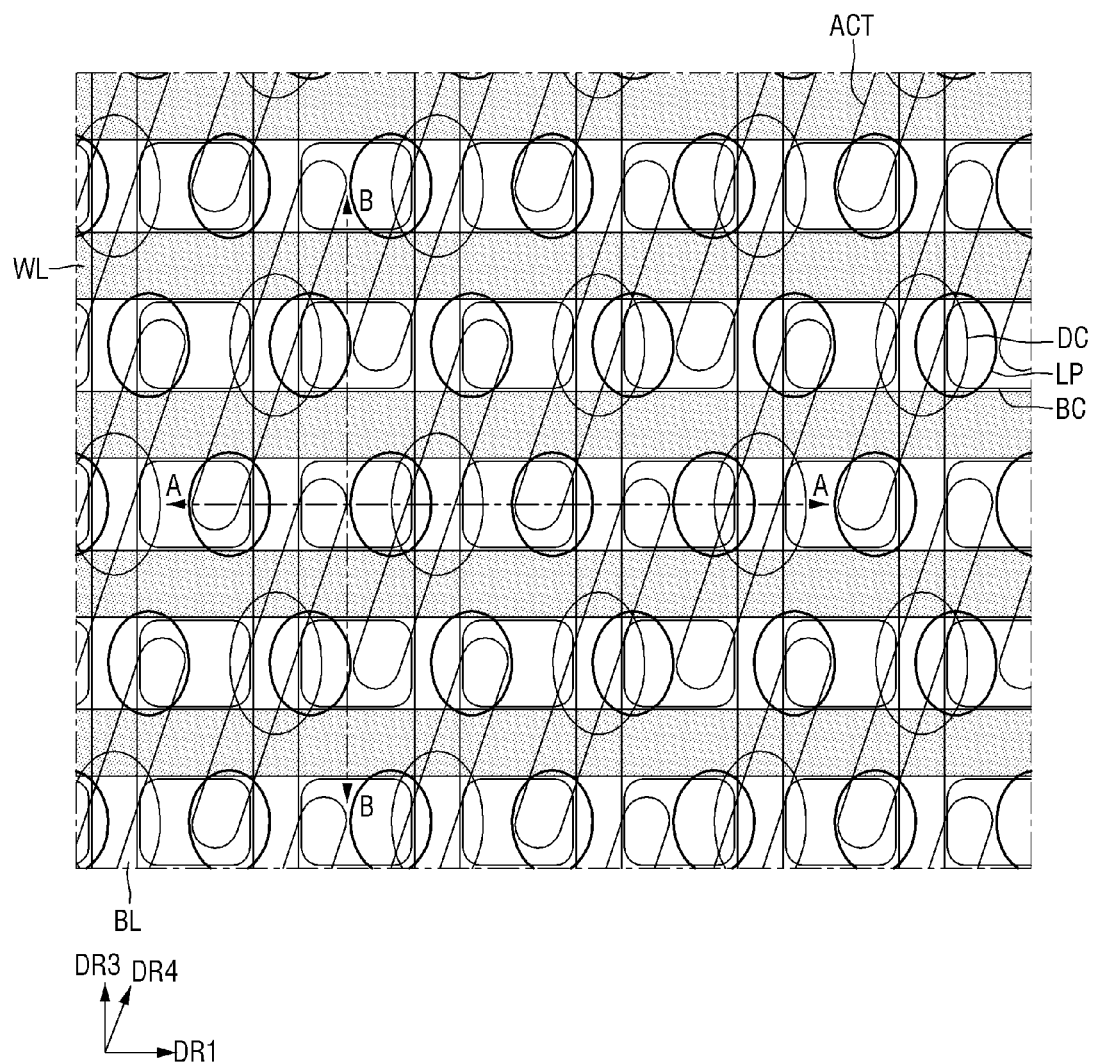
FIG. 9 is an illustrative layout diagram for illustrating a semiconductor memory device according to some embodiments.
Figure 10:
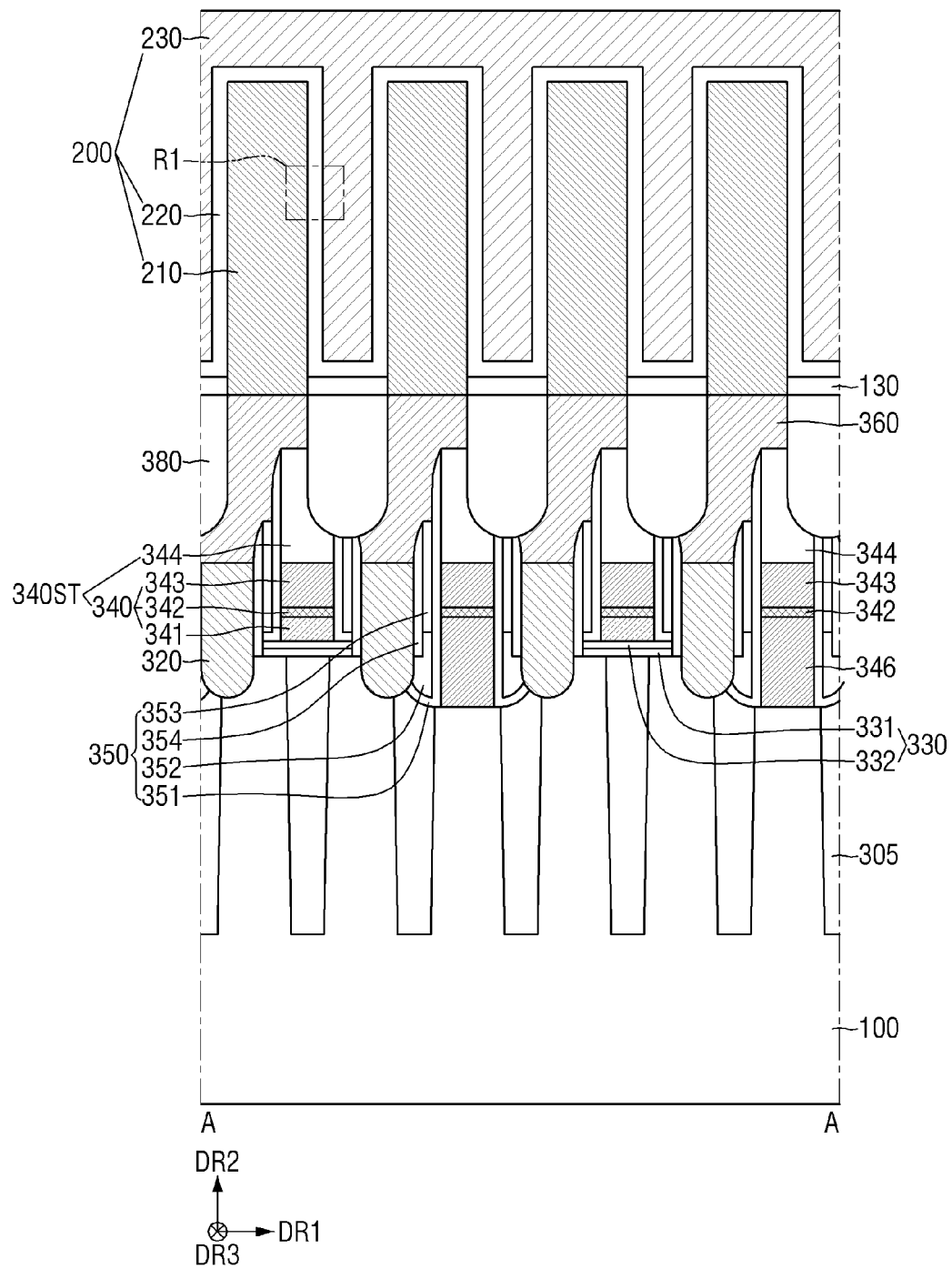
FIG. 10 is a cross-sectional view taken along A-A of FIG. 9.
Figure 11:
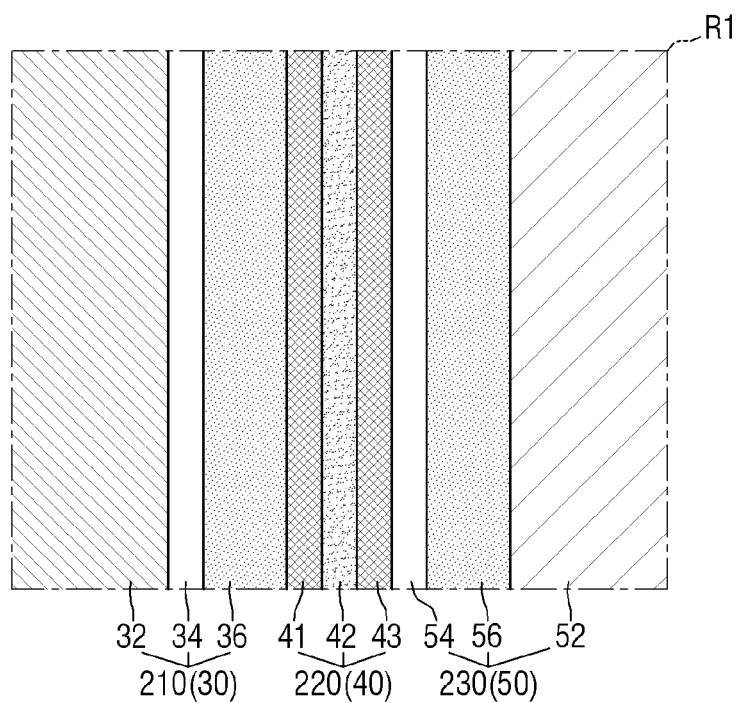
FIG. 11 is an enlarged view to illustrate an R1 area of FIG. 10.
Figure 12:
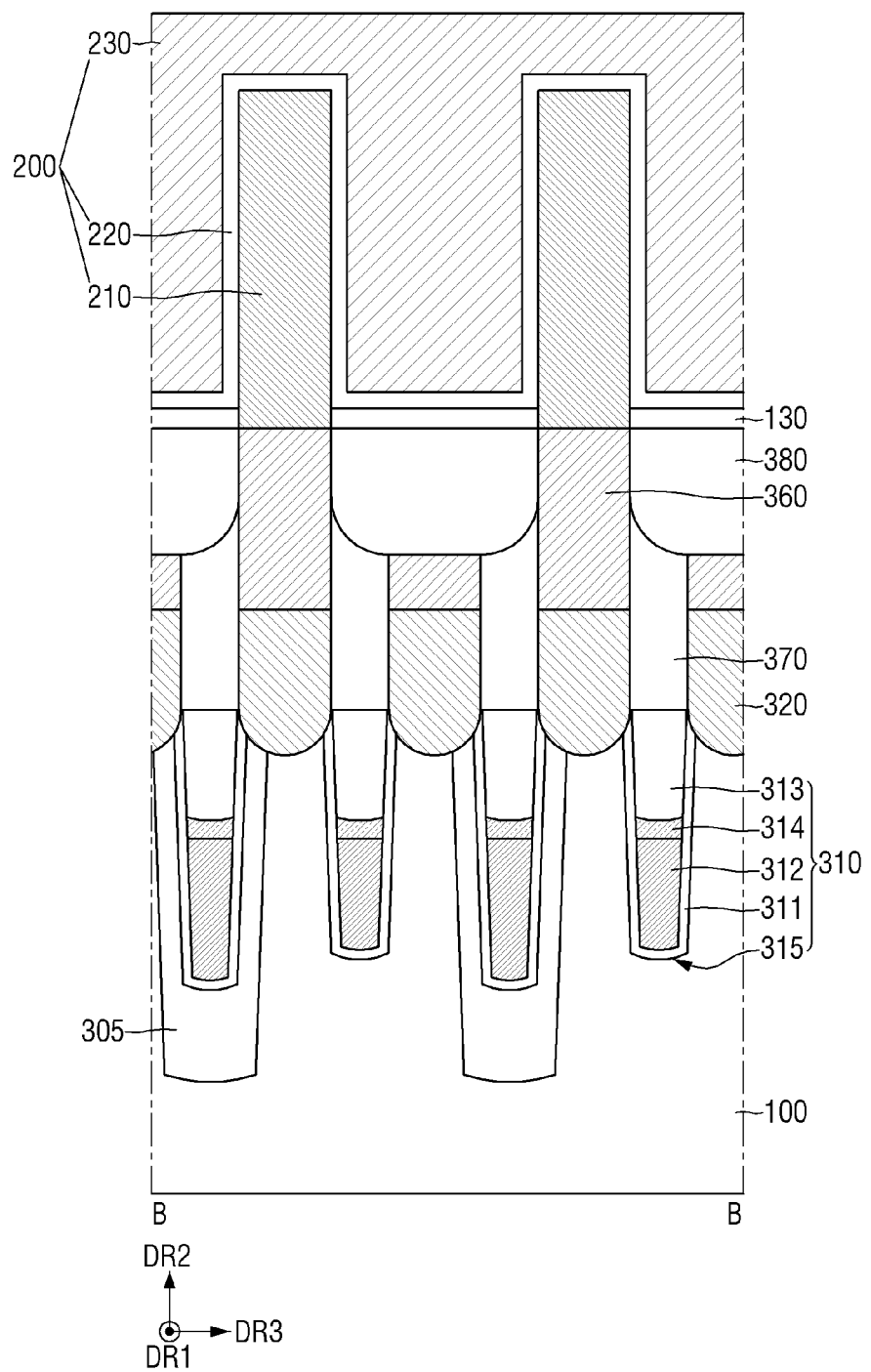
FIG. 12 is a cross-sectional view taken along B-B of FIG. 9.

FIG. 9 is an illustrative layout diagram for illustrating a semiconductor memory device according to some embodiments. FIG. 10 is a cross-sectional view taken along A-A of FIG. 9. FIG. 11 is an enlarged view to illustrate an R1 area of FIG. 10. FIG. 12 is a cross-sectional view taken along B-B of FIG. 9. A first direction DR1, a third direction DR3, and a fourth direction D4 may be parallel to an upper surface of the substrate 100, and a second direction D2 may be perpendicular to the upper surface of the substrate 100. In some embodiments, the first direction DR1 may be perpendicular to the third direction DR3, and the fourth direction DR4 may extend along a diagonal direction between the first and third directions DR1 and DR3.

Referring to FIG. 9, the semiconductor device according to some embodiments may include a plurality of active areas ACT. The active area ACT may be defined by an element isolation film (305 in FIG. 10) formed within the substrate (100 in FIG. 10).

As a design rule of the semiconductor device is reduced, the active area ACT may extend in a diagonal line or an oblique line as shown. The active area ACT may have a bar shape extending in the fourth direction DR4.

A plurality of gate electrodes may be disposed on the active area ACT and may extend in the first direction DR1 and across the active area ACT. A plurality of gate electrodes may extend parallel with each other. The plurality of gate electrodes may act as, for example, a plurality of word-lines WL.

The word-lines WL may be arranged and spaced from each other by an equal spacing. A width of the word-line WL or a spacing between the word-lines WL may be determined according to the design rule.

A plurality of bit-lines BL extending in the third direction DR3 and in an orthogonal manner to the word-lines WL may be disposed on the word-lines WL. The plurality of bit-lines BL may extend parallel with each other.

The bit-lines BL may be arranged and spaced from each other by an equal spacing. A width of the bit-line BL or the spacing between the bit-lines BL may be determined according to the design rule.

The semiconductor device according to some embodiments may include various contact arrangements formed on the active area ACT. The various contact arrangements may include, for example, a direct contact DC, a buried contact BC, and a landing pad LP, and the like.

In this regard, the direct contact DC may refer to a contact that electrically connects the active area ACT to the bit-line BL. The buried contact BC may refer to a contact connecting the active area ACT to a lower electrode (210 of FIG. 10) of a capacitor structure (200 of FIG. 10).

In a layout structure, a contact area between the buried contact BC and the active area ACT may be small. Accordingly, a conductive landing pad LP may be introduced to expand the contact area between the active area ACT and the buried contact BC, and to expand the contact area between the buried contact BC and the lower electrode (210 in FIG. 10) of the capacitor.

The landing pad LP may be disposed between the active area ACT and the buried contact BC, and between the buried contact BC and the lower electrode of the capacitor. The contact area may increase via the introduction of the landing pad LP, such that a contact resistance between the active area ACT and the lower electrode of the capacitor may be reduced.

In the semiconductor device according to some embodiments, the direct contact DC may be disposed on a middle portion of the active area ACT. The buried contact BC may be disposed at each of opposite ends of the active area ACT.

As the buried contact BC is disposed at each of opposite ends of the active area ACT, the landing pad LP may be disposed adjacent to each of opposite ends of the active area ACT and may partially overlap the buried contact BC.

In other words, the buried contact BC may be formed to overlap the active area ACT and the element isolation film (305 in FIG. 10) between adjacent word-lines WL and between adjacent bit-lines BL.

The word-line WL may be formed as a structure buried in the substrate 100. The word-line WL may extend across the active area ACT between the direct contacts DC or between the buried contacts BC.

As shown, two word-lines WL may extend through one active area ACT. As the active area ACT extends along in the diagonal manner, the extension direction of the word-line WL may have an angle smaller than 90 degrees with respective to the extension direction of the active area ACT.

The direct contacts DC and the buried contacts BC may be arranged in a symmetrical manner. Accordingly, the direct contacts DC and the buried contacts BC may be arranged in a straight line along the first direction DR1 and the third direction DR3.

Unlike the direct contact DC and the buried contact BC, the landing pads LP may be arranged in a zigzag manner in the third direction DR3 which the bit-line BL extends. Further, the landing pads LP may overlap the same portion of a side face of each bit-line BL in the first direction DR1 in which the word-line WL extends.

For example, each of landing pads LP in a first line may overlap the left side face of a corresponding bit-line BL, while each of the landing pads LP in a second line may overlap a right side face of the corresponding bit-line BL.

Referring to FIG. 9 to FIG. 12, the semiconductor device according to some embodiments may include a gate structure 310, a plurality of bit-line structures 340ST, a capacitor contact 320, and a capacitor structure 200.

The element isolation film 305 may be formed in the substrate 100. The element isolation film 305 may have an STI (shallow trench isolation) structure having excellent element isolation capability. The element isolation film 305 may define the active area ACT on the substrate 100.

The active area ACT defined by the element isolation film 305 may have an elongated island shape including a minor axis and a major axis as shown in FIG. 9. The active area ACT may have a diagonally extension shape so as to have an angle of smaller than 90 degrees with respect to the extension direction of the word-line WL horizontally flush with the element isolation film 305.

The element isolation film 305 may include or may be formed of, for example, at least one of a silicon oxide film, a silicon nitride film, and a silicon oxynitride film. However, the present disclosure is not limited thereto. Although the element isolation film 305 is illustrated as being embodied as one insulating film, the present disclosure is not limited thereto. Depending on a width of the element isolation film 305, each element isolation film 305 may be embodied as one insulating film or a stack of a plurality of insulating films.

Further, the active area ACT may have a diagonally extension shape so as to have an angle of smaller than 90 degrees with respect to an extension direction of the bit-line BL formed on the element isolation film 305. That is, the active area ACT may extend in the fourth direction DR4 having a predetermined angle with respect to the first direction DR1 and the third direction DR3.

The gate structure 310 may be formed in the substrate 100 and the element isolation film 305. The gate structure 310 may be formed across the element isolation film 305 and the active area ACT defined by the element isolation film 305. The gate structure 310 may include a gate trench 315 formed in the substrate 100 and the element isolation film 305, a gate insulating film 311, a gate electrode 312, a gate capping pattern 313, and a gate capping conductive film 314. In this regard, the gate electrode 312 may act as the word-line WL. Unlike what is illustrated above, the gate structure 310 may not include the gate capping conductive film 314.

The gate insulating film 311 may extend along a sidewall and a bottom surface of the gate trench 315. The gate insulating film 311 may extend along a profile of at least portion of the gate trench 315. The gate insulating film 311 may include or may be formed of, for example, at least one of silicon oxide, silicon nitride, silicon oxynitride, or a high dielectric constant material having a higher dielectric constant than that of silicon oxide. The high dielectric constant material may include or may be formed of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof.

The gate electrode 312 may be formed on the gate insulating film 311. The gate electrode 312 may fill a portion of the gate trench 315. The gate capping conductive film 314 may extend along a top face (i.e., a top surface) of the gate electrode 312.

The gate electrode 312 may include or may be formed of at least one of a metal, a metal alloy, a conductive metal nitride, a conductive metal carbonitride, a conductive metal carbide, a metal silicide, a doped semiconductor material, a conductive metal oxynitride, and a conductive metal oxide. The gate electrode 312 may include or may be formed of, for example, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and a combination thereof. However, the disclosure is not limited thereto. The gate capping conductive film 314 may include or may be formed of, for example, polysilicon or polysilicon germanium. However, the present disclosure is not limited thereto.

The gate capping pattern 313 may be disposed on the gate electrode 312 and the gate capping conductive film 314. The gate capping pattern 313 may fill a remaining portion of the gate trench 315 except for the gate electrode 312 and the gate capping conductive film 314. The gate insulating film 311 is illustrated as extending along a sidewall of the gate capping pattern 313. However, the present disclosure is not limited thereto. The gate capping pattern 313 may include or may be formed of, for example, at least one of silicon nitride (SiN), silicon oxynitride (SiON), silicon oxide (SiO$_2$), silicon carbonitride (SiCN), silicon oxycarbonitride (SiOCN), and a combination thereof.

Although not shown, an impurity doped area may be formed on at least one side of the gate structure 310. The impurity doped area may act as a source/drain area of the transistor.

The bit-line structure 340ST may include a cell conductive line 340 and a cell line capping film 344. The cell conductive line 340 may be formed on the substrate 100 on which the gate structure 310 has been formed, and on the element isolation film 305. The cell conductive line 340 may intersect the element isolation film 305 and the active area ACT. The cell conductive line 340 may intersect the gate structure 310. In this regard, the cell conductive line 340 may act as the bit-line BL.

The cell conductive line 340 may be embodied as a multilayer. The cell conductive line 340 may include, for example, a first cell conductive film 341, a second cell conductive film 342, and a third cell conductive film 343. The first to third cell conductive films 341, 342, and 343 may be sequentially stacked on the substrate 100 and the element isolation film 305. Although the cell conductive line 340 is shown to be embodied as a triple layer, the present disclosure is not limited thereto.

Each of the first to third cell conductive films 341, 342, and 343 may include or may be formed of, for example, at least one of a semiconductor material doped with impurities, a conductive silicide compound, a conductive metal nitride, and a metal alloy. For example, the first cell conductive film 341 may include or may be formed of a doped semiconductor material. The second cell conductive film 342 may include or may be formed of at least one of a conductive silicide compound and a conductive metal nitride. The third cell conductive film 343 may include or may be formed of at least one of a metal and a metal alloy. However, the present disclosure is not limited thereto.

A bit-line contact 346 may be formed between the cell conductive line 340 and the substrate 100. That is, the cell conductive line 340 may be formed on the bit-line contact 346. For example, the bit-line contact 346 may be formed at a point where the cell conductive line 340 intersects a middle portion of the active area ACT having an elongate island shape.

The bit-line contact 346 may electrically connect the cell conductive line 340 and the substrate 100 with each other. In this regard, the bit-line contact 346 may act as the direct contact DC. The bit-line contact 346 may include or may be formed of, for example, at least one of a semiconductor material doped with impurities, a conductive silicide compound, a conductive metal nitride, and a metal.

In FIG. 10, in an area overlapping a top face of the bit-line contact 346, the cell conductive line 340 may include a second cell conductive film 342 and a third cell conductive film 343. In an area non-overlapping the top face of the bit-line contact 346, the cell conductive line 340 may include the first to third cell conductive films 341, 342, and 343.

The cell line capping film 344 may be disposed on the cell conductive line 340. The cell line capping film 344 may extend along a top face of the cell conductive line 340 in the third direction DR3. In this regard, the cell line capping film 344 may include or may be formed of, for example, at least one of a silicon nitride film, a silicon oxynitride, a silicon carbonitride, and a silicon oxycarbonitride. In the semiconductor memory device according to some embodiments, the cell line capping film 344 may include or may be, for example, a silicon nitride film. Although the cell line capping film 344 is illustrated as being embodied as a single film, the present disclosure is not limited thereto. The cell line capping film 344 may be embodied as a multilayer. However, when films constituting the multilayer are made of the same material, the cell line capping film 344 may be construed as being embodied as a single film.

A cell insulating film 330 may be formed on the substrate 100 and the element isolation film 305. More specifically, the cell insulating film 330 may be formed on a portion of the substrate 100 on which the bit-line contact 346 is not formed, and on the element isolation film 305. The cell insulating film 330 may be formed between the substrate 100 and the cell conductive line 340 and between the element isolation film 305 and the cell conductive line 340.

The cell insulating film 330 may be embodied as a single film. However, as shown, the cell insulating film 330 may be embodied as a multi-layer including a first cell insulating film 331 and a second cell insulating film 332. For example, the first cell insulating film 331 may include or may be a silicon oxide film, and the second cell insulating film 332 may include or may be a silicon nitride film. However, the present disclosure is not limited thereto.

A cell line spacer 350 may be disposed on a sidewall of each of the cell conductive line 340 and the cell line capping film 344. In an area of the cell conductive line 340 where the bit-line contact 346 is formed, the cell line spacer 350 may be formed on the substrate 100 and the element isolation film 305. The cell line spacer 350 may be disposed on the sidewall of each of the cell conductive line 340, the cell line capping film 344 and the bit-line contact 346.

However, in a remaining area of the cell conductive line 340 where the bit-line contact 346 is not formed, the cell line spacer 350 may be disposed on the cell insulating film 330. The cell line spacer 350 may be disposed on the sidewalls of the cell conductive line 340 and the cell line capping film 344.

The cell line spacer 350 may be embodied as a single layer. However, as illustrated, the cell line spacer 350 may be embodied as a multilayer including first to fourth cell line spacers 351, 352, 353 and 354. For example, each of the first to fourth cell line spacers 351, 352, 353, and 354 may include or may be formed of one of a silicon oxide film, a silicon nitride film, a silicon oxynitride film (SiON), a silicon oxycarbonitride film (SiOCN), air, and a combination thereof. However, the present invention is not limited thereto.

For example, the second cell line spacer 352 may not be disposed on the cell insulating film 330, but may be disposed on the sidewall of the bit-line contact 346. The fourth cell line spacer 354 may be disposed on a top face of the gate structure 310, and the fourth cell line spacer 354 may extend along a sidewall of the cell conductive line 340 adjacent thereto in the first direction DR1, and a top face of the gate capping pattern 313. For example, the second cell line spacer 352 may not be disposed on the cell insulating film 330, but may be disposed on the sidewall of the bit-line contact 346.

A fence pattern 370 may be disposed on the substrate 100 and the element isolation film 305. The fence pattern 370 may be formed so as to overlap the gate structure 310 formed in the substrate 100 and the element isolation film 305. The fence pattern 370 may be disposed between the bit-line structures 340ST extending in the third direction DR3. The fence pattern 370 may include or may be formed of, for example, at least one of silicon oxide, silicon nitride, silicon oxynitride, and a combination thereof.

The capacitor contact 320 may be disposed between bit-lines BL adjacent to each other in the first direction DR1. Specifically, the capacitor contact 320 may be disposed between cell conductive lines 340 adjacent to each other in the first direction DR1. The capacitor contact 320 may be disposed between fence patterns 370 adjacent to each other in the third direction DR3. The capacitor contact 320 may overlap portions of the substrate 100 and the element isolation film 305 between the adjacent cell conductive lines 340. The capacitor contact 320 may be connected to the active area ACT. In this regard, the capacitor contact 320 may act as the buried contact BC.

The capacitor contact 320 may include or may be formed of, for example, at least one of a semiconductor material doped with impurities, a conductive silicide compound, a conductive metal nitride, and a metal.

A storage pad 360 may be formed on the capacitor contact 320. The storage pad 360 may be electrically connected to the capacitor contact 320. The storage pad 360 may be connected to the active area. The storage pad 360 may act as the landing pad LP.

The storage pad 360 may overlap a portion of the top face of the bit-line structure 340ST. The storage pad 360 may include or may be formed of, for example, at least one of a semiconductor material doped with impurities, a conductive silicide compound, a conductive metal nitride, a conductive metal carbide, a metal, and a metal alloy.

A pad isolation insulating film 380 may be formed on the storage pad 360 and the bit-line structure 340ST. For example, the pad isolation insulating film 380 may be disposed on the cell line capping film 344. The pad isolation insulating film 380 may isolate the storage pads 360 as a plurality of isolated areas from each other. The pad isolation insulating film 380 may not cover the top face of the storage pad 360. For example, a vertical dimension from the top face of the substrate 100 to a top face of the storage pad 360 may be the same as a vertical dimension from the top face of the substrate 100 to a top face of the pad isolation insulating film 380.

The pad isolation insulating film 380 may include or may be an insulating material, and may electrically insulate the plurality of storage pads 360 from each other. For example, the pad isolation insulating film 380 may include or may be, for example, at least one of a silicon oxide film, a silicon nitride film, a silicon oxynitride film, a silicon oxycarbonitride film, and a silicon carbonitride film.

An etch stop layer 130 may be disposed on the top face of the storage pad 360 and the top face of the pad isolation insulating film 380. The etch stop layer 130 may include or may be formed of, for example, at least one of silicon nitride (SiN), silicon carbonitride (SiCN), silicon oxycarbonitride (SiOCN), silicon oxycarbide SiOC, and silicon boron nitride (SiBN).

The capacitor structure 200 may be disposed on the capacitor contact 320 and the storage pad 360. The capacitor structure 200 may be connected to the storage pad 360. That is, the capacitor structure 200 may be electrically connected to the capacitor contact 320.

The capacitor structure 200 may include the lower electrode 210, a capacitor dielectric film 220, and an upper electrode 230.

The lower electrode 210, the capacitor dielectric film 220, and the upper electrode 230 included in the capacitor structure 200 may correspond to the lower electrode 30, the capacitor dielectric film 40, and the upper electrode 50 as described above with reference to FIG. 1 to FIG. 8, respectively.

For example, as shown in FIG. 11, the lower electrode 210 may include the lower electrode film 32, the first metal oxide film 34 and the first doped oxide film 36 that are sequentially stacked. The capacitor dielectric film 220 may include the first zirconium oxide film 41, the second zirconium oxide film 43, and the hafnium oxide film 42 disposed between the first zirconium oxide film 41 and the second zirconium oxide film 43. Further, the upper electrode 230 may include the second metal oxide film 54, the second doped oxide film 56, and the upper electrode film 52 that are sequentially stacked. Thus, the semiconductor memory device including the capacitor structure 200 having improved capacitance and reduced stress may be provided.

Figure 13:
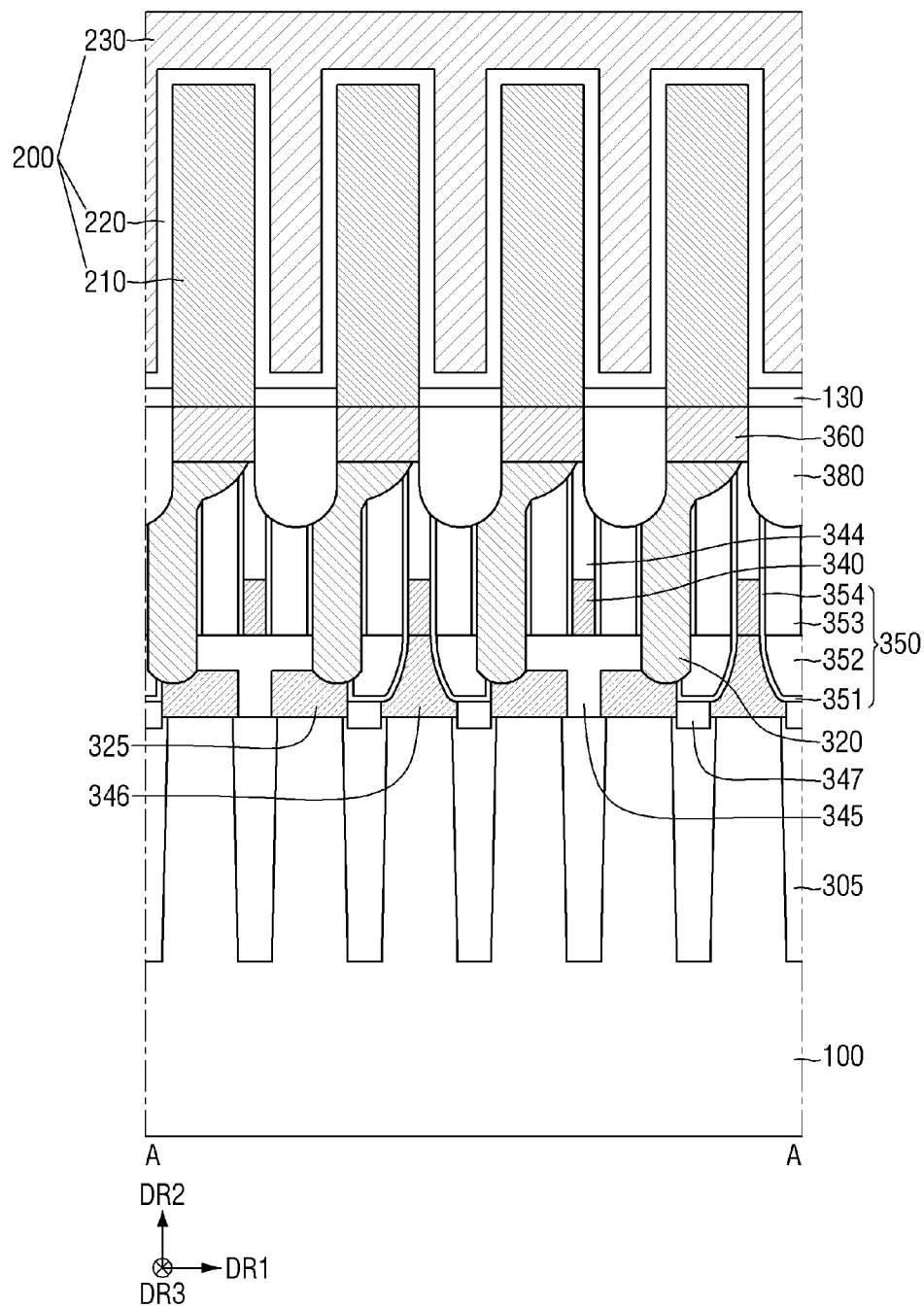
FIG. 13 is a diagram for illustrating a semiconductor memory device according to some embodiments.

FIG. 13 is a diagram for illustrating a semiconductor memory device according to some embodiments. For reference, FIG. 13 shows a cross-sectional view taken along A-A of FIG. 9. For convenience of description, following description will be based on differences thereof from the descriptions as set forth above with reference to FIG. 9 to FIG. 12.

Referring to FIG. 13, the semiconductor device according to some embodiments may further include a node pad 325.

The bit-line contact 346 includes a top face connected to the cell conductive line 340 and a bottom face (i.e., a bottom surface) connected to the active area of the substrate 100. A dimension of the top face of the bit-line contact 346 in the first direction DR1 may be smaller than a dimension of a bottom face of the bit-line contact 346 in the first direction DR1. As the bit-line contact 346 extends away from the cell conductive line 340, a width of the bit-line contact 346 may gradually increase. That is, the width of the bit-line contact 346 may gradually increase as the bit-line contact extends in a direction from a top to a bottom thereof.

The node pad 325 may be disposed on the substrate 100. The node pad 325 may be disposed on the active area. The node pad 325 may be disposed between the capacitor contact 320 and the substrate 100.

A vertical dimension from a top face of the element isolation film 305 to a top face of the node pad 325 may be smaller than a vertical dimension from the top face of the element isolation film 305 to a top face of the bit-line contact 346. A vertical dimension from the top face of the element isolation film 305 to the top face of the node pad 325 may be smaller than a vertical dimension from the top face of the element isolation film 305 to a bottom face of the cell conductive line 340.

A contact isolation pattern 347 may be interposed between the bit-line contact 346 and the node pad 325 adjacent thereto. The contact isolation pattern 347 may include or may be formed of an insulating material.

A node isolation pattern 345 may be interposed between adjacent node pads 325. The node isolation pattern 345 is disposed on the substrate 100. The node isolation pattern 345 may isolate the node pads 325 adjacent to each other in the first direction DR1 from each other. The node isolation pattern 345 may cover top faces of the node pads 325 adjacent to each other in the first direction DR1. In a cross-sectional view, the node isolation pattern 345 may have a "T" shape.

A top face of the node isolation pattern 345 may be coplanar with the top face of the bit-line contact 346. A vertical dimension from the top face of the element isolation film 305 to the top face of the node isolation pattern 345 may be equal to a vertical dimension from the top face of the element isolation film 305 to the top face of the bit-line contact 346. The vertical dimension from the top face of the element isolation film 305 to the top face of the node isolation pattern 345 may be equal to a vertical dimension from the top face of the element isolation film 305 to the bottom face of the cell conductive line 340.

The node isolation pattern 345 may include or may be formed of, for example, an insulating material. A bottom face of the node isolation pattern 345 may have the same vertical level as that of the top face of the element isolation film 305. However, the present disclosure is not limited thereto. A vertical level of the bottom face of the node isolation pattern 345 may be lower than that of the top face of the element isolation film 305.

A stacked structure of a portion of the cell conductive line 340 in an area overlapping the top face of the bit-line contact 346 may be the same as a stacked structure of a portion of the cell conductive line 340 in an area non-overlapping the top face of the bit-line contact 346.

The capacitor contact 320 is connected to the node pad 325. The capacitor contact 320 connects the node pad 325 and the storage pad 360 with each other.

Figure 14:
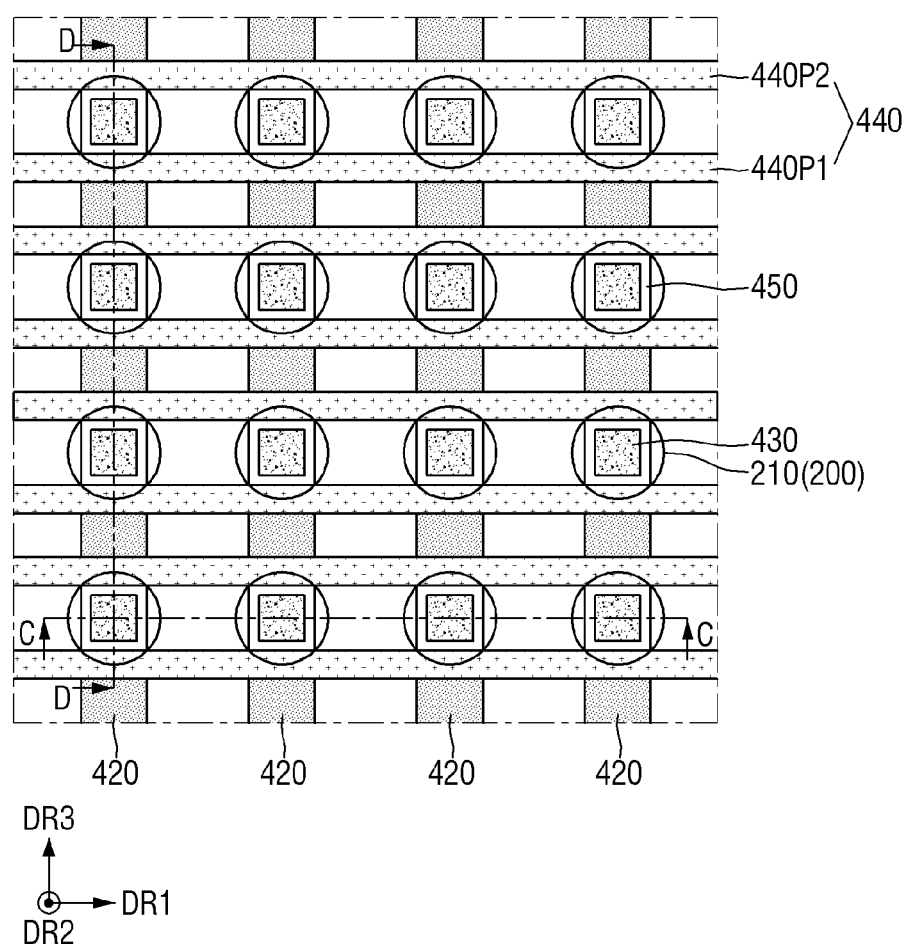
FIG. 14 is an illustrative layout diagram for illustrating a semiconductor memory device according to some embodiments.
Figure 15:
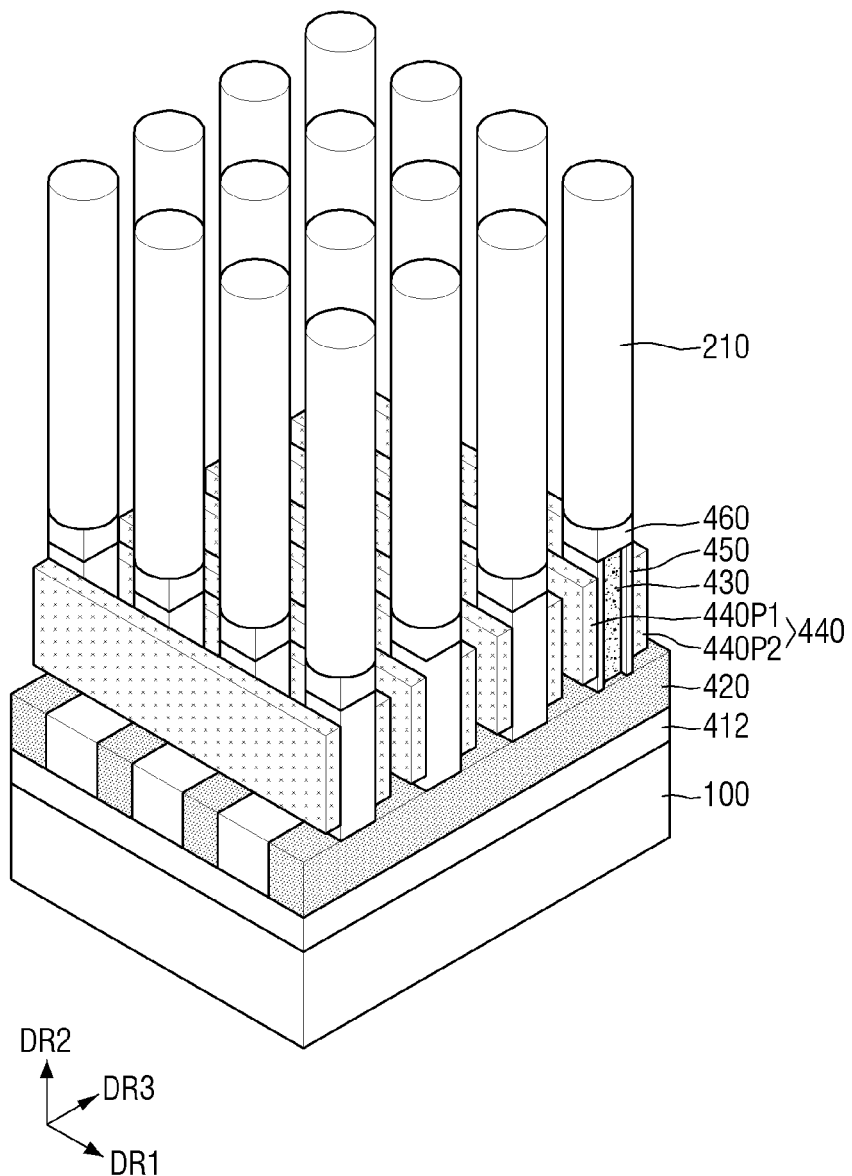
FIG. 15 is a perspective view to illustrate the semiconductor memory device of FIG. 14.
Figure 16:
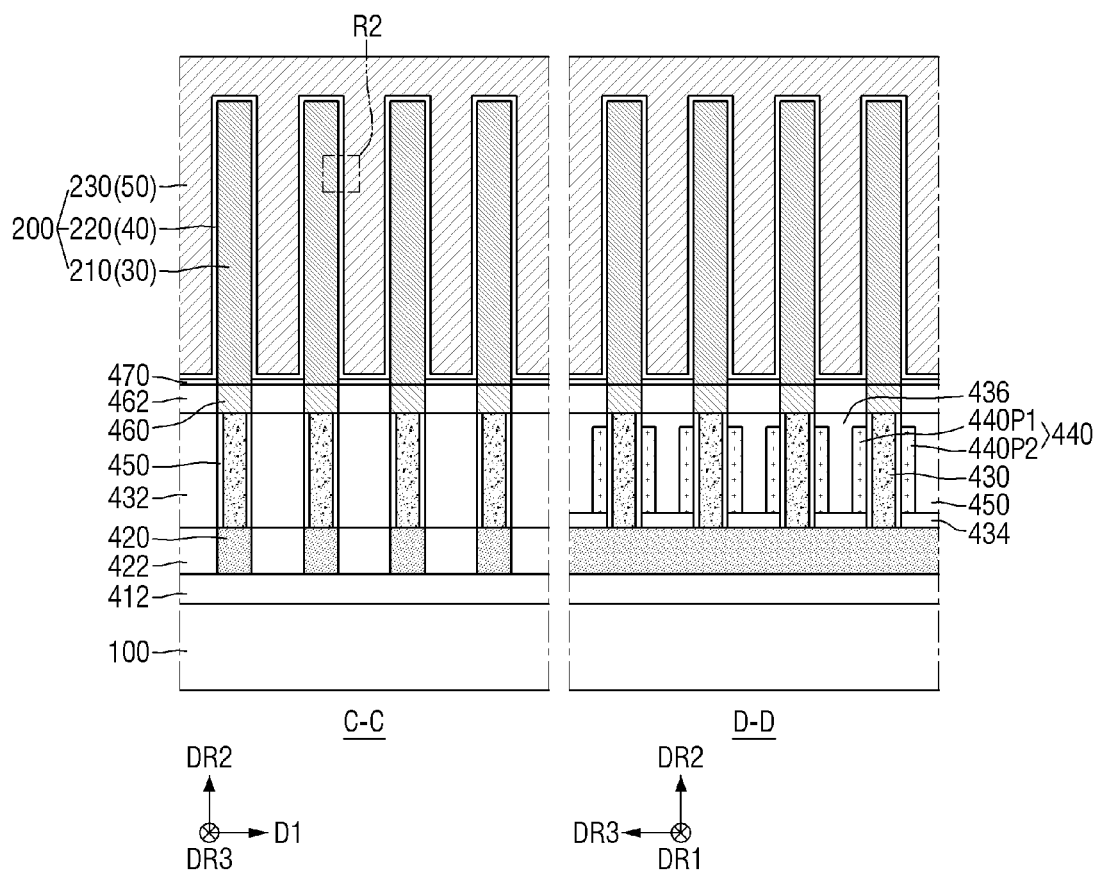
FIG. 16 is a cross-sectional view taken along C-C and D-D of FIG. 14.
Figure 17:
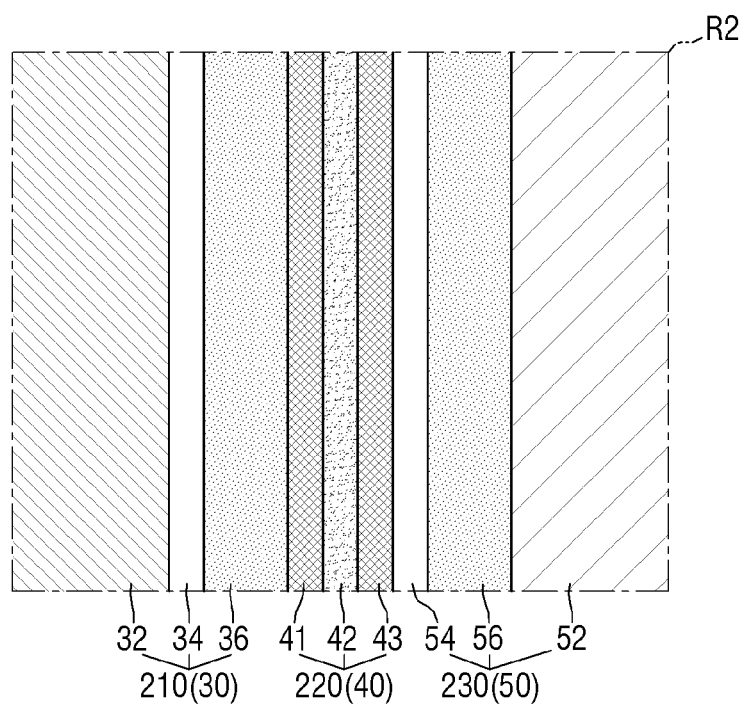
FIG. 17 is an enlarged view to illustrate an R2 area of FIG. 16.

FIG. 14 is an illustrative layout diagram for illustrating a semiconductor memory device according to some embodiments. FIG. 15 is a perspective view to illustrate the semiconductor memory device of FIG. 14. FIG. 16 is a cross-sectional view taken along C-C and D-D of FIG. 14. FIG. 17 is an enlarged view to illustrate an R2 area of FIG. 16.

Referring to FIG. 14 to FIG. 17, the semiconductor memory device may include the substrate 100, a plurality of first conductive lines 420, a channel layer 430, a gate electrode 440, a gate insulating layer 450, and the capacitor structure 200. The semiconductor device of FIG. 14 to FIG. 17 may be a memory device including a vertical channel transistor (VCT). The vertical channel transistor may refer to a structure in which a channel length of the channel layer 430 extends along a vertical direction from the substrate 100.

The capacitor structure 200 in FIGS. 14 to 17 may be the same as the capacitor structure 200 as described with reference to FIGS. 9 to 12.

A lower insulating layer 412 may be disposed on the substrate 100. The plurality of first conductive lines 420 may be disposed on the lower insulating layer 412 and may be spaced apart from each other in the first direction DR1 and extend in the third direction DR3. A plurality of first insulating patterns 422 may be disposed on the lower insulating layer 412 so as to fill spaces between adjacent ones of the plurality of first conductive lines 420. The plurality of first insulating patterns 422 may extend in the third direction DR3. A top face of each of the plurality of first insulating patterns 422 may be coplanar with a top face of each of the plurality of first conductive lines 420. Each of the plurality of first conductive lines 420 may function as a bit-line of the semiconductor device.

In some embodiments, each of the plurality of first conductive lines 420 may include or may be formed of doped polysilicon, metal, conductive metal nitride, conductive metal silicide, conductive metal oxide, or a combination thereof. For example, each of the plurality of first conductive lines 420 may include or may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof. However, the present disclosure is not limited thereto. Each of the plurality of first conductive lines 420 may include a single layer or multiple layers made of the aforementioned materials. In some embodiments, each of the plurality of first conductive lines 420 may include or may be formed of a two-dimensional (2D) semiconductor material. For example, the 2D semiconductor material may include graphene, carbon nanotube, or a combination thereof.

The channel layers 430 may be arranged in a matrix form and may be spaced apart from each other in the first direction DR1 and the third direction DR3 and may be disposed on the plurality of first conductive lines 420. The channel layer 430 may have a first width along the first direction DR1 and a first vertical dimension along the second direction DR2. The first vertical dimension may be larger than the first width. For example, the first vertical dimension may be about 2 to 10 times the first width. However, the present disclosure is not limited thereto. A bottom portion of the channel layer 430 may function as a first source/drain area (not shown). A top portion of the channel layer 430 may function as a second source/drain area (not shown). A portion of the channel layer 430 between the first and second source/drain areas may function as a channel area (not shown).

In some embodiments, the channel layer 430 may include or may be formed of an oxide semiconductor. For example, the oxide semiconductor may include In$_x$Ga$_y$Zn$_z$O, In$_x$Ga$_y$Si$_z$O, In$_x$Sn$_y$Zn$_z$O, In$_x$Zn$_y$O, Zn$_x$O, Zn$_x$Sn$_y$O, Zn$_x$O$_y$N, Zr$_x$Zn$_y$Sn$_z$O, Sn$_x$O, Hf$_x$In$_y$Zn$_z$O, Ga$_x$Zn$_y$Sn$_z$O, Al$_x$Zn$_y$Sn$_z$O, Yb$_x$Ga$_y$Zn$_z$O, In$_x$Ga$_y$O or a combination thereof. The channel layer 430 may include a single layer or multiple layers made of the oxide semiconductor. In some embodiments, the channel layer 430 may have a bandgap energy greater than that of silicon. For example, the channel layer 430 may have a bandgap energy of about 1.5 eV to about 5.6 eV. For example, the channel layer 430 may have desirable channel performance when it has a bandgap energy of about 2.0 eV to 4.0 eV. For example, the channel layer 430 may include or may be made of polycrystalline or amorphous. However, the present disclosure is not limited thereto. In some embodiments, the channel layer 430 may include or may be formed of a two-dimensional (2D) semiconductor material. For example, the 2D semiconductor material may include graphene, carbon nanotubes, or a combination thereof.

The gate electrode 440 may extend in the first direction DR1 and may be disposed on opposite sidewalls of the channel layer 430. The gate electrode 440 may include a first sub-gate electrode 440P1 facing a first sidewall of the channel layer 430 and a second sub-gate electrode 440P2 facing a second sidewall opposite the first sidewall of the channel layer 430. As one channel layer 430 is disposed between the first sub-gate electrode 440P1 and the second sub-gate electrode 440P2, the semiconductor device may have a dual gate transistor structure. However, the technical idea of the present disclosure is not limited thereto, and the second sub-gate electrode 440P2 may be omitted and only the first sub-gate electrode 440P1 facing the first sidewall of the channel layer 430 may be formed to achieve a single gate transistor structure.

The gate electrode 440 may include or may be formed of doped polysilicon, metal, conductive metal nitride, conductive metal silicide, conductive metal oxide, or a combination thereof. For example, the gate electrode 440 may include or may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, Ni Si, CoSi, IrO$_x$, RuO$_x$, or a combination thereof. However, the present disclosure is not limited thereto.

Figure 29:
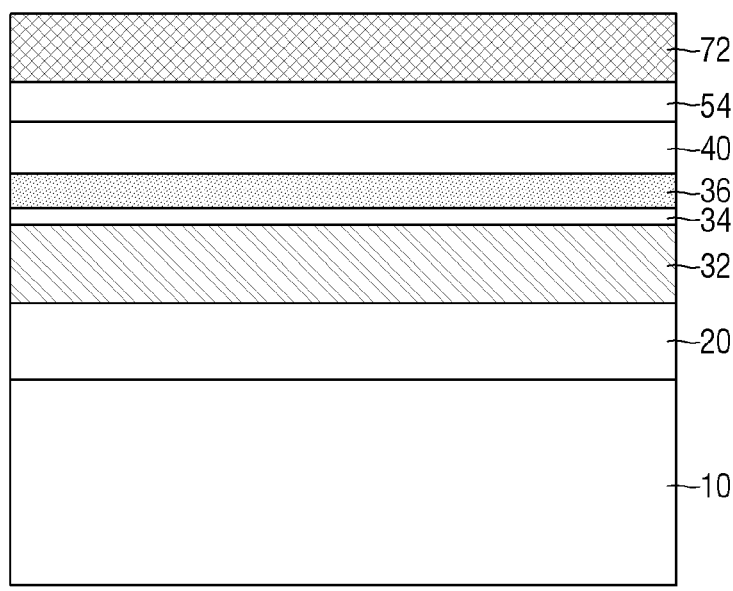

The gate insulating layer 450 may surround a sidewall of the channel layer 430 and may be interposed between the channel layer 430 and the gate electrode 440. For example, as shown in FIG. 29, an entirety of the sidewall of the channel layer 430 may be surrounded with the gate insulating layer 450. A portion of the sidewall of the gate electrode 440 may be in contact with the gate insulating layer 450. In some embodiments, the gate insulating layer 450 may extend in an extension direction of the gate electrode 440, that is, the first direction DR1, and only two sidewalls facing the gate electrode 440 among the sidewalls of the channel layer 430 may be in contact with the gate insulating layer 450.

In some embodiments, the gate insulating layer 450 may be composed of a silicon oxide film, a silicon oxynitride film, a high dielectric constant film having a higher dielectric constant than that of a silicon oxide film, or a combination thereof. The high dielectric constant film may include or may be made of metal oxide or metal oxynitride. For example, the high dielectric constant film as the gate insulating layer 450 may include or may be made of $HfO_2$, HfSiO, HfSiON, HfTaO, HfSiO, HfZrO, $ZrO_2$, $Al_2O_3$, or a combination thereof. However, the present disclosure is not limited thereto.

A plurality of second insulating patterns 432 may be respectively disposed on the plurality of first insulating patterns 422 and may extend along the third direction DR3. The channel layer 430 may be disposed between two adjacent second insulating patterns 432 among the plurality of second insulating pattern 432. Further, a first buried layer 434 and a second buried layer 436 may be disposed between two adjacent second insulating patterns 432 and in a space between two adjacent channel layers 430. The first buried layer 434 may be disposed at a bottom portion of the space between two adjacent channel layers 430, and the second buried layer 436 may be formed on the first buried layer 434 so as to fill the remainder of the space between two adjacent channel layers 430. A top face of the second buried layer 436 may be coplanar with a top face of the channel layer 430, and the second buried layer 436 may cover a top face of the gate electrode 440. In some embodiments, the plurality of second insulating patterns 432 may be continuous and monolithic with the plurality of first insulating patterns 422, respectively, or the second buried layer 436 may be continuous and monolithic with the first buried layer 434.

A capacitor contact 460 may be disposed on the channel layer 430. The capacitor contact 460 may vertically overlap the channel layer 430. The capacitor contacts 460 may be arranged in a matrix form and may be spaced apart from each other in the first direction DR1 and the third direction DR3. The capacitor contact 460 may include or may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. However, the present disclosure is not limited thereto. An upper insulating layer 462 may surround a sidewall of the capacitor contact 460 and may be disposed on the plurality of second insulating patterns 432 and the second buried layer 436.

An etch stop layer 470 may be disposed on the upper insulating layer 462, and the capacitor structure 200 may be disposed on the etch stop layer 470. The capacitor structure 200 may include the lower electrode 210, the capacitor dielectric film 220 and the upper electrode 230.

The lower electrode 210 may extend through the etch stop layer 470 and may be electrically connected to a top face of the capacitor contact 460. The lower electrode 210 may be formed in a pillar type extending in the second direction DR2. However, the present disclosure is not limited thereto. In some embodiments, the lower electrode 210 may vertically overlap the capacitor contact 460. The lower electrodes may be arranged in a matrix form and may be spaced apart from each other in the first direction DR1 and the third direction DR3. In some embodiments, a landing pad (not shown) may be further disposed between the capacitor contact 460 and the lower electrode 210 so that the lower electrodes 210 may be arranged in a hexagonal manner.

The lower electrode 210, the capacitor dielectric film 220, and the upper electrode 230 may correspond to the lower electrode 30, the capacitor dielectric film 40, and the upper electrode 50 as described with reference to FIG. 1 to FIG. 8, respectively.

For example, as shown in FIG. 17, the lower electrode 210 may include the lower electrode film 32, the first metal oxide film 34 and the first doped oxide film 36 that are sequentially stacked.

The capacitor dielectric film 220 may include the first zirconium oxide film 41, the second zirconium oxide film 43, and the hafnium oxide film 42 disposed between the first zirconium oxide film 41 and the second zirconium oxide film 43. Further, the upper electrode 230 may include the second metal oxide film 54, the second doped oxide film 56, and the upper electrode film 52 that are sequentially stacked.

Thus, the semiconductor memory device including the capacitor structure 200 having improved capacitance and reduced stress may be provided.

Although it is illustrated in FIG. 17 that the capacitor dielectric film 220 includes only the first zirconium oxide film 41, the second zirconium oxide film 43, and the hafnium oxide film 42, an embodiment is not limited thereto. For example, as shown in FIG. 3 to FIG. 7, the capacitor dielectric film 220 may further include the first aluminum oxide film 45a or the third zirconium oxide film 44.

Figure 18:
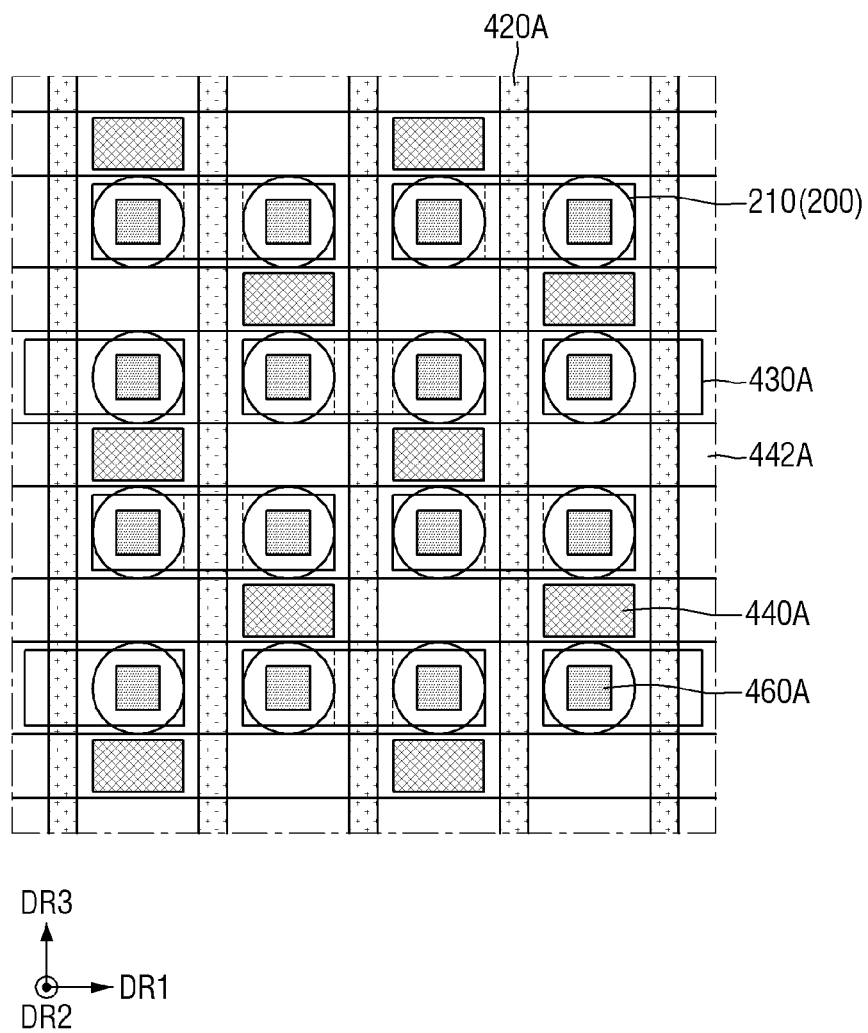
FIG. 18 is an illustrative layout diagram for illustrating a semiconductor memory device according to some embodiments.
Figure 19:
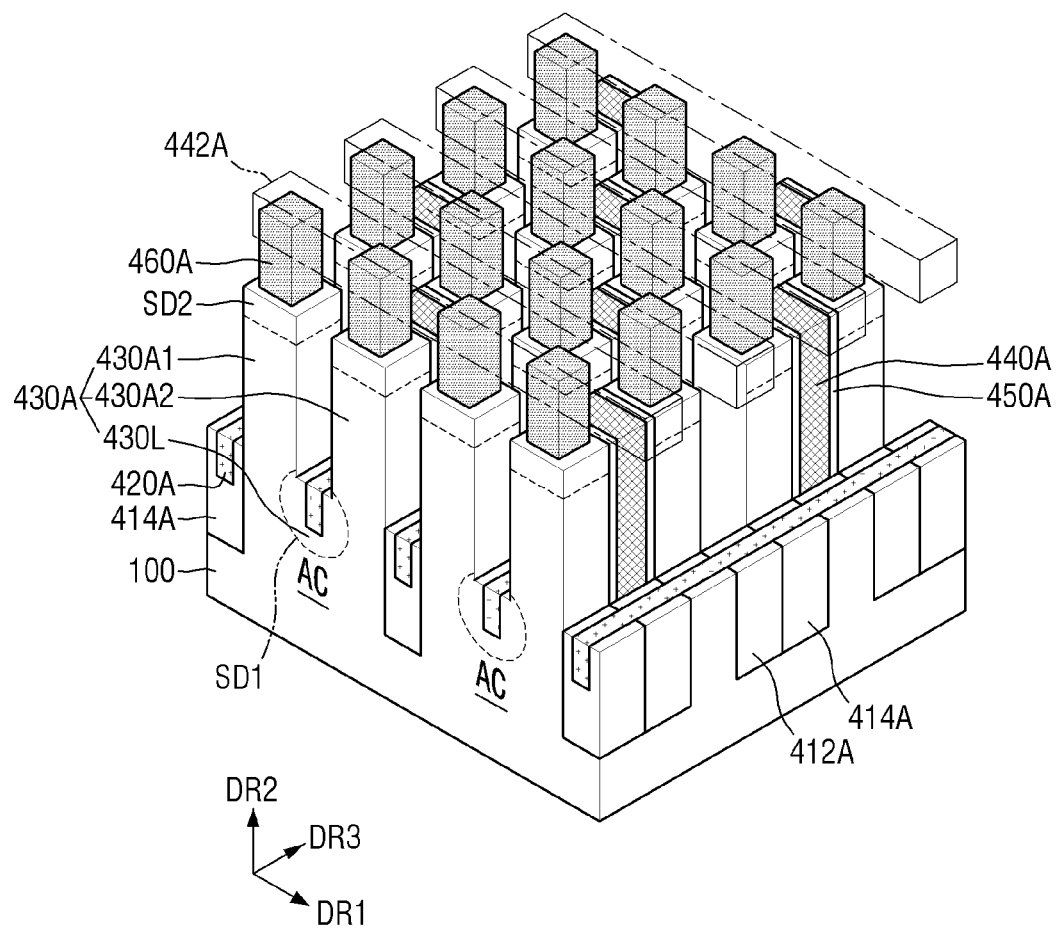
FIG. 19 is a perspective view to illustrate the semiconductor memory device of FIG. 18.

FIG. 18 is an illustrative layout diagram for illustrating a semiconductor memory device according to some embodiments. FIG. 19 is a perspective view to illustrate the semiconductor memory device of FIG. 18. For convenience of description, descriptions that are duplicate with those as set forth with reference to FIG. 1 to FIG. 8 are briefly made or omitted.

Referring to FIG. 18 and FIG. 19, the semiconductor memory device according to some embodiments may include the substrate 100, a plurality of first conductive lines 420A, a channel structure 430A, a contact gate electrode 440A, a plurality of second conductive lines 442A and the capacitor structure 200. The semiconductor device may be a memory device including a vertical channel transistor (VCT).

A plurality of active areas AC may be defined in the substrate 100 and by a first element isolation film 412A and a second element isolation film 414A. The channel structure 430A may be disposed in each active area AC. The channel structure 430A may include a first active pillar 430A1 and a second active pillar 430A2 extending in a vertical direction, and a connective portion 430L connected to a bottom portion of the first active pillar 430A1 and a bottom portion of the second active pillar 430A2. A first source/drain area SD1 may be disposed in the connective portion 430L. A second source/drain area SD2 may be disposed at a top portion of each of the first and second active pillars 430A1 and 430A2. Each of the first active pillar 430A1 and the second active pillar 430A2 may constitute an independent unit memory cell.

The plurality of first conductive lines 420A may extend so as to intersect the plurality of active areas AC. For example, the plurality of first conductive lines 420A may extend in the third direction DR3. One first conductive line 420A of the plurality of first conductive lines 420A may be disposed on the connective portion 430L and between the first active pillar 430A1 and the second active pillar 430A2, and may be disposed on the first source/drain area SD1. Another first conductive line 420A adjacent to said one first conductive line 420A may be disposed between two channel structures 430A. One first conductive line 420A among the plurality of first conductive lines 420A may function as a common bit-line of two unit memory cells respectively including the first active pillar 430A1 and the second active pillar 430A2. The first and second active pillars 430A1 and 430A2 may be respectively disposed on opposite sides of said one first conductive line 420A.

One contact gate electrode 440A may be disposed between two channel structures 430A adjacent to each other in the third direction DR3. For example, the contact gate electrode 440A may be disposed between the first active pillar 430A1 included in one channel structure 430A and the second active pillar 430A2 of another channel structure 430A adjacent thereto. One contact gate electrode 440A may be shared by the first active pillar 430A1 and the second active pillar 430A2 respectively disposed on both sidewalls thereof. A gate insulating layer 450A may be disposed between the contact gate electrode 440A and the first active pillar 430A1 and between the contact gate electrode 440A and the second active pillar 430A2. A plurality of second conductive lines 442A may extend in the first direction DR1 and may be disposed on a top face of the contact gate electrode 440A. Each of the plurality of second conductive lines 442A may function as a word-line of the semiconductor device.

A capacitor contact 460A may be disposed on the channel structure 430A. The capacitor contact 460A may be disposed on the second source/drain area SD2. The capacitor structure 200 may be disposed on the capacitor contact 460A.

The capacitor structure 200 may correspond to the capacitor structure CS as described above using FIGS. 1 to 8. Therefore, detailed descriptions thereof will be omitted below.

Hereinafter, a method for manufacturing a capacitor structure according to some embodiments will be described with reference to FIG. 1 to FIG. 8 and FIG. 20 to FIG. 33.

FIG. 20 to FIG. 33 are diagrams of intermediate structures corresponding to steps for illustrating a method for manufacturing a capacitor structure according to some embodiments.

Figure 20:
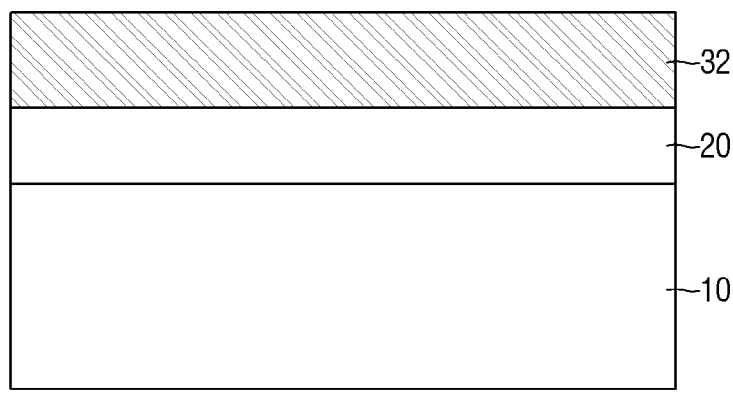
FIG. 20 to FIG. 33 are diagrams of intermediate structures corresponding to steps for illustrating a method for manufacturing a capacitor structure according to some embodiments.

Referring to FIG. 20, the lower insulating film 20 and the lower electrode film 32 are formed on the substrate 10.

The lower insulating film 20 may be formed on the substrate 10. The lower insulating film 20 may include or may be formed of, for example, at least one of silicon oxide, silicon nitride, silicon oxynitride, and a low dielectric constant (low-k) material having a dielectric constant smaller than that of silicon oxide.

The lower electrode film 32 may be formed on the lower insulating film 20. The lower electrode film 32 may include or may be formed of the first metal element. The first metal element may include, for example, at least one of titanium (Ti), tantalum (Ta), tungsten (W), and ruthenium (Ru). However, the present disclosure is not limited thereto. In some embodiments, the lower electrode film 32 may include or may be formed of a nitride of the first metal element.

Figure 21:
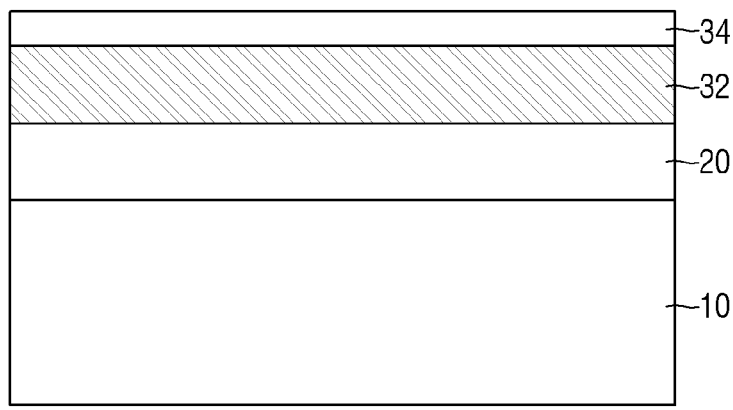

Referring to FIG. 21, the first metal oxide film 34 is formed on the lower electrode film 32.

The first metal oxide film 34 may cover the lower electrode film 32. The first metal oxide film 34 may include or may be formed of the oxide of the first metal element. The first metal oxide film 34 may be formed using an oxidation process of the lower electrode film 32. However, the present disclosure is not limited thereto. In some embodiments, the first metal oxide film 34 may be a natural oxide film of the lower electrode film 32.

In some embodiments, forming the first metal oxide film 34 may include performing a low-temperature oxidation process of the lower electrode film 32. The low-temperature oxidation process may be performed, for example, in a temperature range from room temperature to 200° C.

Figure 22:
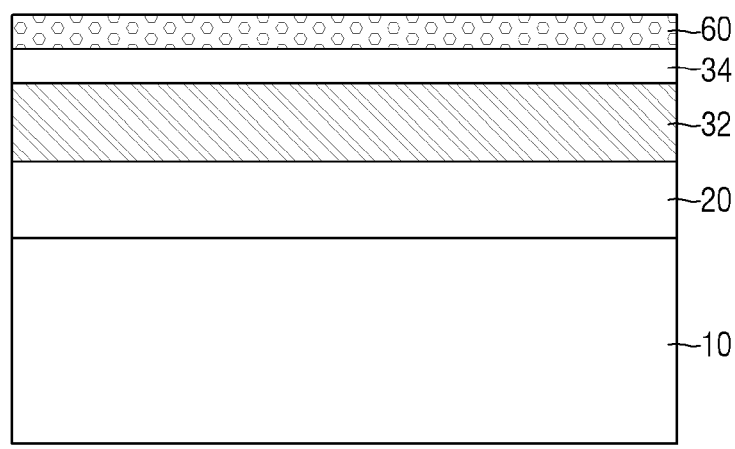

Referring to FIG. 22, a blocking film 60 is formed on the first metal oxide film 34.

The blocking film 60 may cover the first metal oxide film 34. The blocking film 60 may include or may be formed of silicon oxide. The blocking film 60 may contain an impurity element. The impurity element may include at least one of aluminum (Al), zirconium Zr, and hafnium (Hf).

In some embodiments, the blocking film 60 may contain an oxide of the impurity element. For example, the blocking film 60 may contain at least one of aluminum oxide, zirconium oxide, and hafnium oxide.

Although the blocking film 60 is shown to be embodied as a single film, this is only illustrative, and the blocking film 60 may be embodied as a multi-layer.

The blocking film 60 may be formed using, for example, a chemical vapor deposition (CVD) process or an atomic layer deposition (ALD) process. In one example, when the blocking film 60 includes the silicon oxide, the blocking film 60 may be formed using a chemical vapor deposition (CVD) process or an atomic layer deposition (ALD) process using a silicon precursor (Si precursor).

Figure 23:
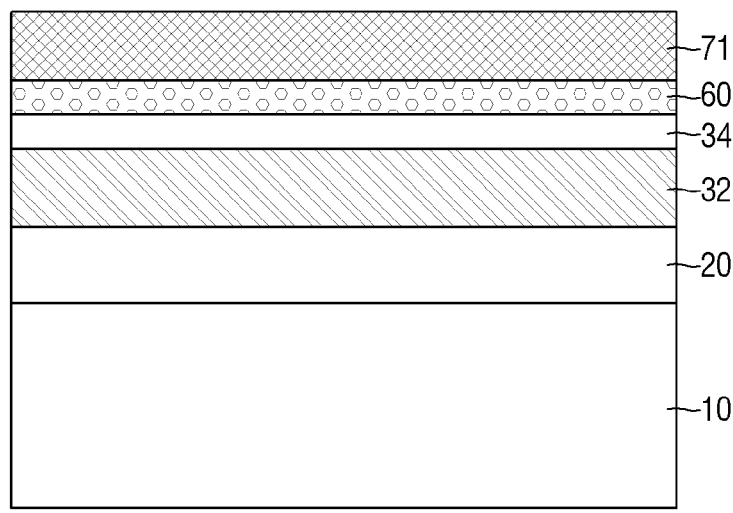

Referring to FIG. 23, a first dopant film 71 is formed on the blocking film 60.

The first dopant film 71 may cover the blocking film 60. The first dopant film 71 may include the second metal element. For example, the first dopant film 71 may include or may be formed of the second metal element, an oxide of the second metal element, or a nitride of the second metal element. The first dopant film 71 may be formed using, for example, a deposition process, for example, a chemical vapor deposition (CVD) process or an atomic layer deposition (ALD) process. However, the present disclosure is not limited thereto.

In some embodiments, the second metal element may include or may be a metal element selected from at least one of Group 5 to Group 11 and Group 15 metal elements. For example, the second metal element may include or may be a metal element, but is not limited thereto, selected from at least one of antimony (Sb), molybdenum (Mo), cobalt (Co), niobium (Nb), copper (Cu), nickel (Ni), and tantalum (Ta).

In the method for manufacturing the capacitor structure according to some embodiments, the blocking film 60 may prevent excessive oxidation of the lower electrode film 32 or the first metal oxide film 34 in the process of forming the first dopant film 71. For example, the first metal oxide film 34 including titanium oxide has a grain structure to allow oxygen atoms (O) to be easily diffused. Further, for example, an ozone reactant ($O_3$ reactant) used to form the first dopant film 71 causes excessive oxidation of the lower electrode film 32 or the first metal oxide film 34. However, as described above, the blocking film 60 may be interposed between the first metal oxide film 34 and the first dopant film 71 to prevent the first metal oxide film 34 from being excessively oxidized. For example, the impurity atom of the blocking film 60 may have a strong bonding force to the oxygen atom (O) or may prevent the oxygen atom (O) from being diffused into the first metal oxide film 34.

Figure 24:
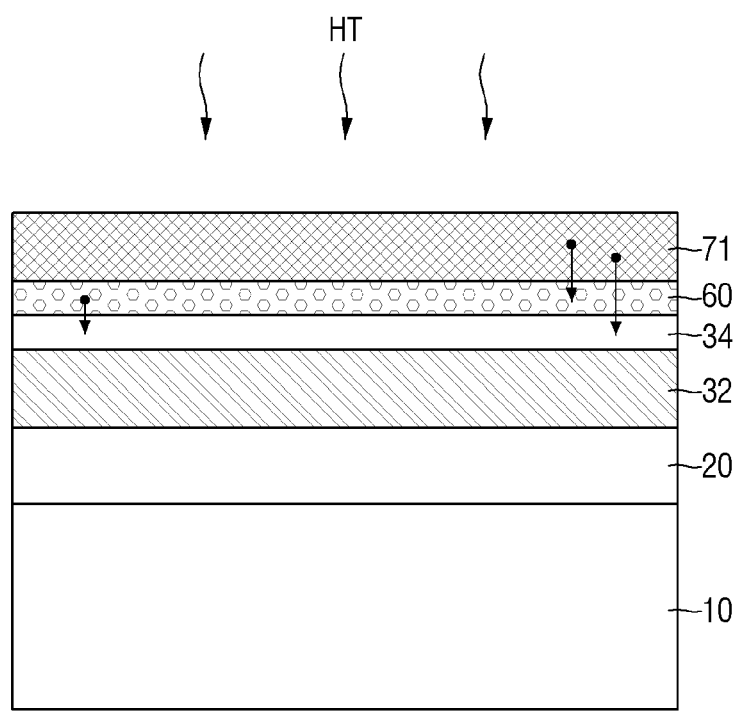
Figure 25:
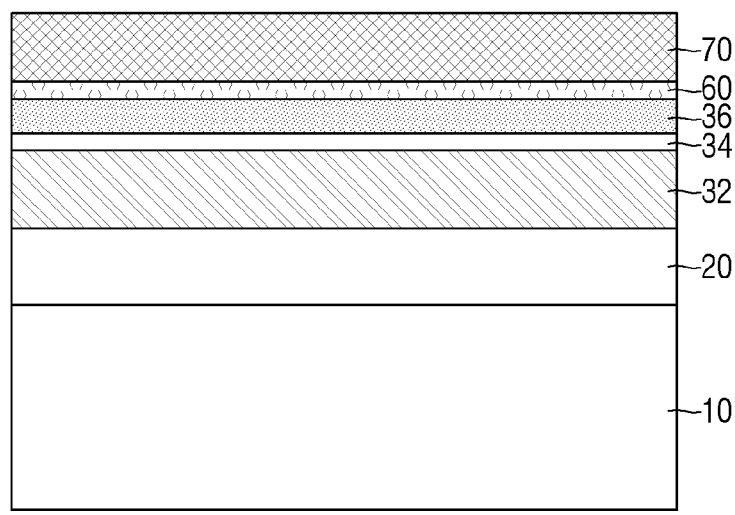

Referring to FIG. 24, a heat treatment process HT is performed.

The heat treatment process HT may include, for example, an annealing process. In some embodiments, the heat treatment process HT may be performed at a temperature of about 200° C. to about 600° C.

Under the heat treatment process HT, at least some of the second metal elements of the first dopant film 71 may be diffused into the first metal oxide film 34 through the blocking film 60. Accordingly, referring to FIG. 25, the first doped oxide film 36 doped with the second metal elements may be formed. In one example, the first doped oxide film 36 including titanium oxide doped with the second metal element may be formed between the lower electrode film 32 and the blocking film 60.

In some embodiments, the first doped oxide film 36 may further contain an impurity element diffused from the blocking film 60. For example, under the heat treatment process HT, at least some of elements (for example, silicon (Si)) included in the blocking film 60 may be diffused into the first metal oxide film 34. In this case, at least some of the impurity elements may remain in the first doped oxide film 36. In some embodiments, under the heat treatment process HT, at least some of the first metal elements of the first metal oxide film 34 may be diffused into the blocking film 60 which in turn may constitute a portion of the first doped oxide film 36. Thus, in one example, the first doped oxide film 36 including the titanium oxide doped with the second metal element and silicon (Si) may be formed between the lower electrode film 32 and the blocking film 60.

In some embodiments, at least some of the second metal elements of the first dopant film 71 may be diffused through the blocking film 60 to a bottom face of the first metal oxide film 34. In this case, the first doped oxide film 36 as described above using FIG. 8 may be formed.

Figure 26:
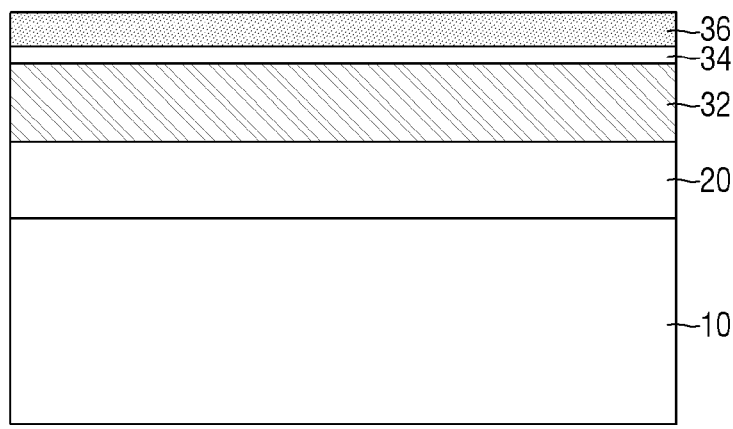

Referring to FIG. 26, the blocking film 60 and the first dopant film 71 are removed.

The blocking film 60 and the first dopant film 71 are removed such that the first doped oxide film 36 is exposed. Removing the blocking film 60 and the first dopant film 71 may include, for example, performing a cleaning process. The cleaning process may be performed, for example, using hydrogen fluoride (HF). However, the present disclosure is not limited thereto.

Figure 27:
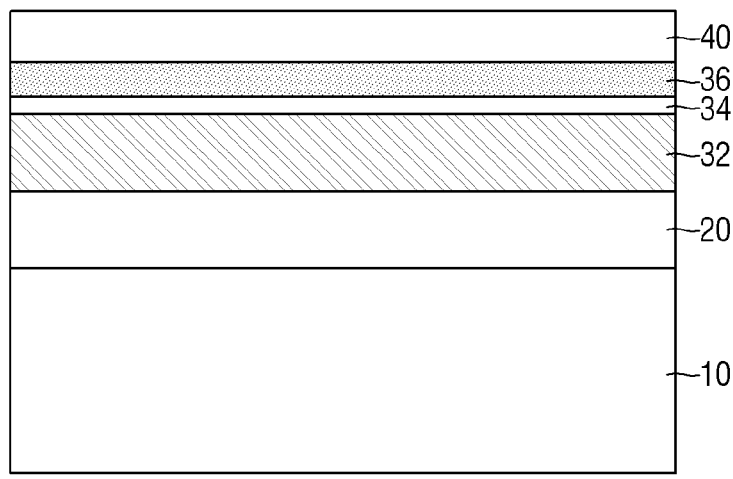

Referring to FIG. 27, the capacitor dielectric film 40 is formed on the first doped oxide film 36.

Forming the capacitor dielectric film 40 may include sequentially forming the first zirconium oxide film 41, the hafnium oxide film 42 and the second zirconium oxide film 43 as shown in FIG. 2 to FIG. 7.

The capacitor dielectric film 40 may be formed, for example, using a chemical vapor deposition (CVD) process or an atomic layer deposition (ALD) process. For example, the first zirconium oxide film 41 may be formed using a chemical vapor deposition (CVD) process or an atomic layer deposition (ALD) process.

A process of depositing the capacitor dielectric film 40 may be performed, for example, at a temperature of about 200° C. to about 400° C. For example, the first zirconium oxide film 41 may be formed using a chemical vapor deposition (CVD) process or an atomic layer deposition (ALD) process at a temperature of about 200° C. to about 400° C.

Figure 28:
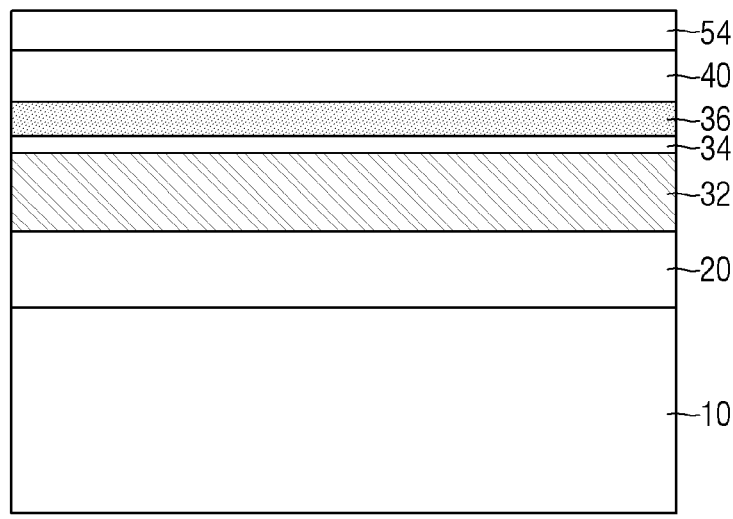

Referring to FIG. 28, the second metal oxide film 54 is formed on the capacitor dielectric film 40.

The second metal oxide film 54 may cover the capacitor dielectric film 40. The second metal oxide film 54 may include or may be formed of an oxide of the first metal element that the first metal oxide film 34 includes. The second metal oxide film 54 may be formed using a deposition process. However, the present disclosure is not limited thereto. In an embodiment, the deposition processes of forming the oxide of the first metal element in the first metal oxide film 34, the second metal oxide film 54, the first doped oxide film 36, and the second doped oxide film 56 may be substantially the same, and the oxides of the first metal element in the first and second metal oxide films 34 and 54, and the first and second doped oxide films 36 and 56 may be substantially identical in kind and/or in stoichiometry. In an embodiment, the oxides of the first metal element of the first and second metal oxide films 34 and 54, and the first and second doped oxide films 36 and 56 may be formed using a natural oxidation process, and the oxides of the first metal element of the first and second metal oxide films 34 and 54, and the first and second doped oxides films 36 and 56 may be substantially identical in kind and/or in stoichiometry. The present invention is not limited thereto. The oxides of the first metal element in the first and second metal oxide films 34 and 54 and the first and second doped oxide films 36 and 56 may be substantially identical in kind, but at least one thereof may be different in stoichiometry from the others. In an embodiment, the oxide of the first metal element may include TiO, TiO2, or TixOy, where x and y are fractional numbers, and the sum thereof is 1.

Referring to FIG. 29, a second dopant film 72 is formed on the second metal oxide film 54.

The second dopant film 72 may cover the second metal oxide film 54. The second dopant film 72 may include or may be formed of a third metal element. For example, the second dopant film 72 may include or may be formed of the third metal element, an oxide of the third metal element, or a nitride of the third metal element. The second dopant film 72 may be formed, for example, using a deposition process, for example, a chemical vapor deposition (CVD) process or an atomic layer deposition (ALD) process. However, the present disclosure is not limited thereto.

In some embodiments, the third metal element may include or may be formed of a metal element selected from at least one of Group 5 to Group 11 and Group 15 metal elements. For example, the third metal element may include or may be formed of a metal element selected from at least one of antimony (Sb), molybdenum (Mo), cobalt (Co), niobium (Nb), copper (Cu), nickel (Ni), and tantalum (Ta). However, the present disclosure is not limited thereto.

The third metal element included in the second dopant film 72 and the second metal element included in the first dopant film 71 may be identical with each other.

Figure 30:
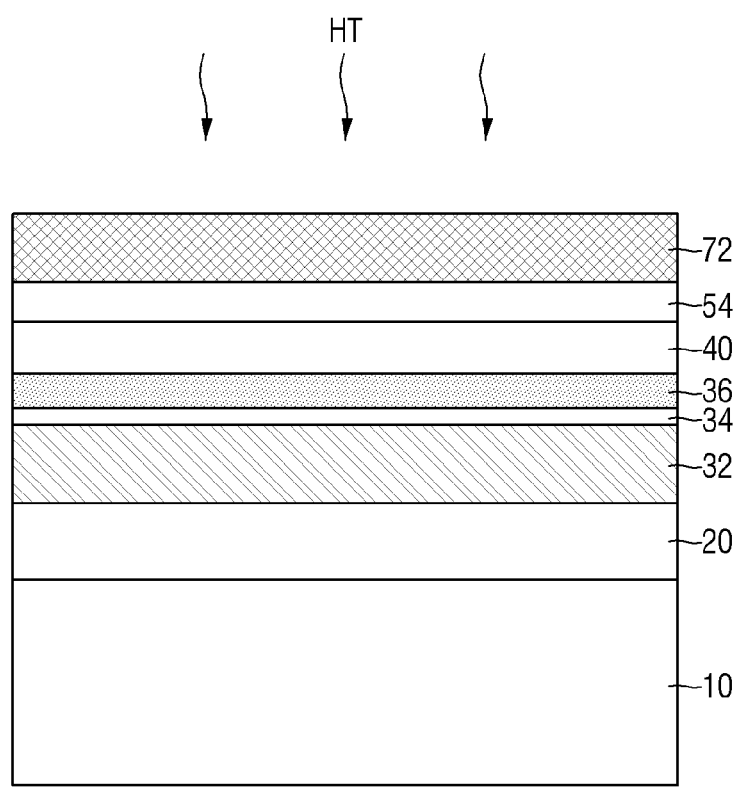

Referring to FIG. 30, a heat treatment process HT is performed.

The heat treatment process HT may include, for example, an annealing process.

Under the heat treatment process HT, at least some of the third metal elements of the second dopant film 72 may be diffused into the second metal oxide film 54.

Figure 31:
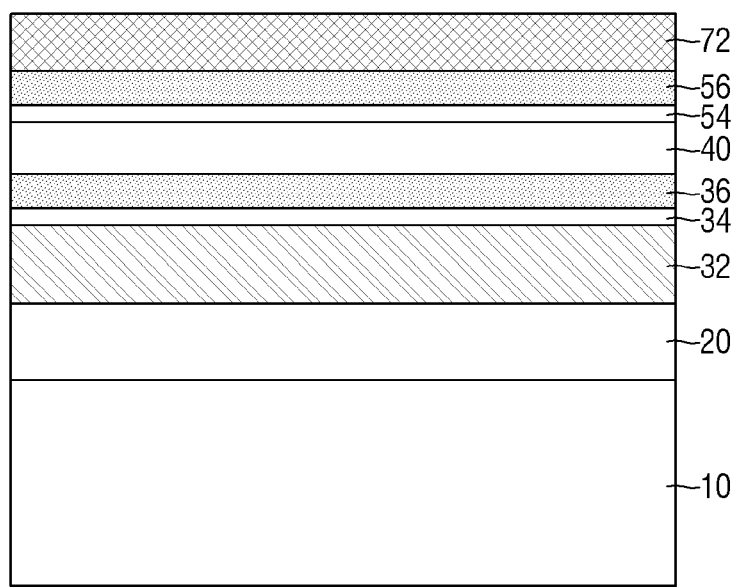

Accordingly, referring to FIG. 31, the second doped oxide film 56 doped with the third metal element may be formed. In one example, the second doped oxide film 56 including titanium oxide doped with the third metal element may be formed between the capacitor dielectric film 40 and the second dopant film 72.

Figure 32:
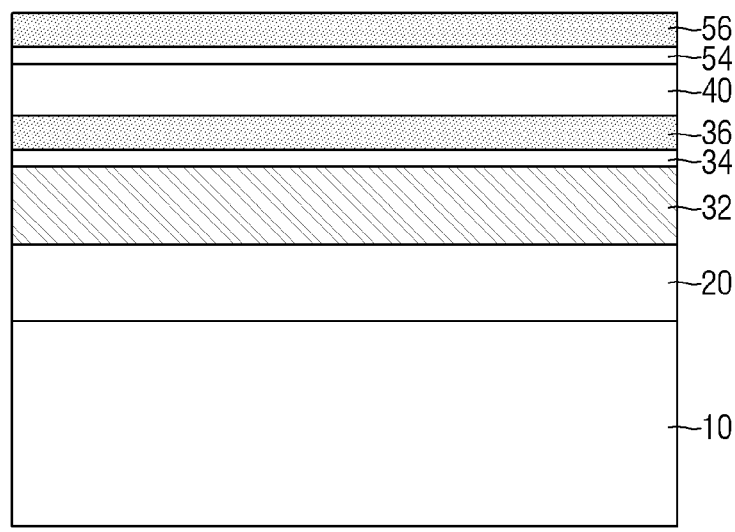

Referring to FIG. 32, the second dopant film 72 is removed.

A process of removing the second dopant film 72 may be performed in substantially the same manner as in the process of removing the first dopant film 71 as described with reference to FIG. 26.

Figure 33:
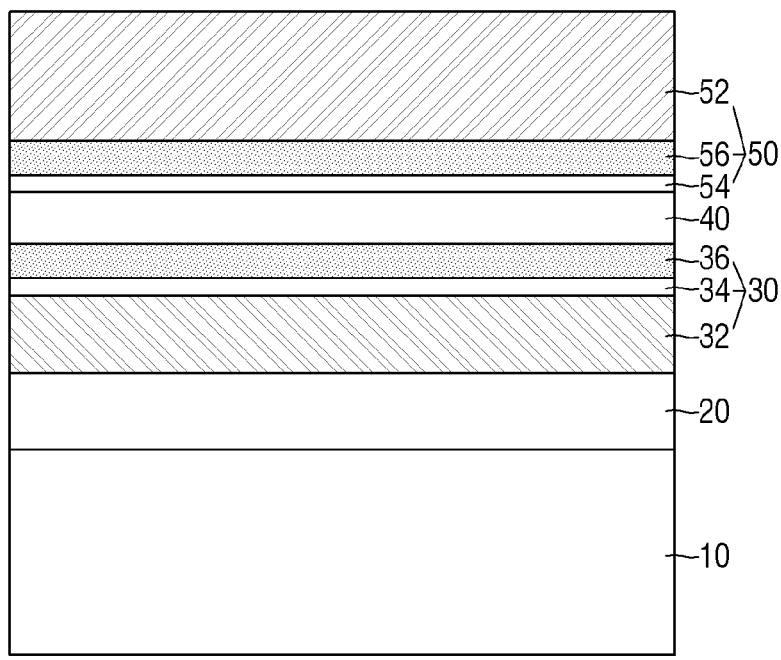

Referring to FIG. 33, the upper electrode film 52 is formed on the second doped oxide film 56. Thus, the capacitor structure CS including the lower electrode 30, the capacitor dielectric film 40, and the upper electrode 50 shown in FIG. 1 may be manufactured.

In concluding the detailed description, those skilled in the art will appreciate that many variations and modifications may be made to the embodiments without substantially departing from the principles of the present invention. Therefore, the disclosed embodiments of the invention are used in a generic and descriptive sense only and not for purposes of limitation.

What is claimed is:

1. A capacitor structure comprising:
a lower electrode;
an upper electrode; and
a capacitor dielectric film interposed between the lower electrode and the upper electrode,
wherein the lower electrode includes:
a lower electrode film including a first metal element;
a first doped oxide film disposed between the lower electrode film and the capacitor dielectric film, wherein the first doped oxide film includes a second metal element and an oxide of the first metal element, and wherein the second metal element includes a metal element selected from at least one of Group 5 to Group 11 and Group 15 metal elements; and
a first metal oxide film disposed between the lower electrode film and the first doped oxide film, wherein the first metal oxide film includes an oxide of the first metal element and is free of the second metal element, and
wherein the upper electrode includes:
an upper electrode film including the first metal element;
a second doped oxide film disposed between the upper electrode film and the capacitor dielectric film, wherein the second doped oxide film includes the second metal element and an oxide of the first metal element; and
a second metal oxide film disposed between the capacitor dielectric film and the second doped oxide film, wherein the second metal oxide film includes an oxide of the first metal element, and is free of the second metal element.

2. The capacitor structure of claim 1,
wherein the capacitor dielectric film includes a first zirconium oxide film, a second zirconium oxide film, and a hafnium oxide film disposed between the first zirconium oxide film and the second zirconium oxide film.

3. The capacitor structure of claim 2,
wherein the capacitor dielectric film further includes an aluminum oxide film.

4. The capacitor structure of claim 3,
wherein the second zirconium oxide film is disposed between the hafnium oxide film and the upper electrode, and
wherein the aluminum oxide film is disposed between the second zirconium oxide film and the upper electrode.

5. The capacitor structure of claim 2,
wherein a thickness of the capacitor dielectric film is selected from a range of 30 to 60 Å, and a thickness of the hafnium oxide film is smaller than or equal to 20 Å.

6. The capacitor structure of claim 1,
wherein the lower electrode film includes a nitride of the first metal element.

7. The capacitor structure of claim 1,
wherein the first metal element and the second metal element are the same in kind.

8. The capacitor structure of claim 1,
wherein the first metal element includes at least one of titanium (Ti), tantalum (Ta), tungsten (W) and ruthenium (Ru), and
wherein the second metal element includes at least one of antimony (Sb), molybdenum (Mo), cobalt (Co), niobium (Nb), copper (Cu), nickel (Ni), tantalum (Ta), vanadium (V), and tungsten (W).

9. The capacitor structure of claim 1,
wherein the first doped oxide film further contains silicon (Si).

10. The capacitor structure of claim 9,
wherein the second doped oxide film is free of silicon (Si).

11. The capacitor structure of claim 1,
wherein the first doped oxide film includes hafnium (Hf), zirconium (Zr), or aluminum (Al).

12. A capacitor structure comprising:
a lower electrode;
an upper electrode; and
a capacitor dielectric film interposed between the lower electrode and the upper electrode,
wherein the lower electrode includes:
a lower electrode film including a first metal element; and
a first doped oxide film disposed between the lower electrode film and the capacitor dielectric film, wherein the first doped oxide film includes a second metal element and an oxide of the first metal element, and wherein the second metal element includes a metal element selected from at least one of Group 5 to Group 11 and Group 15 metal elements,
wherein the upper electrode includes:
an upper electrode film including the first metal element; and
a second doped oxide film disposed between the upper electrode film and the capacitor dielectric film, wherein the second doped oxide film includes a third metal element and the oxide of the first metal element, and wherein the third metal element includes a metal element selected from at least one of Group 5 to Group 11 and Group 15 metal elements, and
wherein the capacitor dielectric film includes a first zirconium oxide film, a second zirconium oxide film, and a first hafnium oxide film disposed between the first zirconium oxide film and the second zirconium oxide film.

13. The capacitor structure of claim 12,
wherein the lower electrode further includes a first metal oxide film disposed between the lower electrode film and the first doped oxide film, and
wherein the first metal oxide film includes an oxide of the first metal element and is free of the second metal element.

14. The capacitor structure of claim 12,
wherein the upper electrode further includes a second metal oxide film disposed between the capacitor dielectric film and the second doped oxide film, and
wherein the second metal oxide film includes an oxide of the first metal element and is free of the third metal element.

15. The capacitor structure of claim 12,
wherein the capacitor dielectric film further includes a second hafnium oxide film and a third zirconium oxide film,
wherein the second hafnium oxide film is disposed between the second zirconium oxide film and the third zirconium oxide film, and
wherein the second zirconium oxide film is disposed between the first hafnium oxide film and the second hafnium oxide film.

16. The capacitor structure of claim 12,
wherein the second metal element and the third metal element are identical with each other.

17. The capacitor structure of claim 12,
wherein the lower electrode includes hafnium oxide, zirconium oxide or aluminum oxide.

18. The capacitor structure of claim 12,
wherein the capacitor dielectric film further includes an aluminum oxide film.

19. A semiconductor memory device comprising:
a substrate including an active area;
a bit-line disposed on the substrate, and extending in a first direction, wherein the bit-line is connected to the active area;
a capacitor contact disposed on the substrate, wherein the capacitor contact is spaced from the bit-line and is connected to the active area;
a word-line disposed on the active area and between the bit-line and the capacitor contact, wherein the word-line extends in a second direction intersecting the first direction; and
a capacitor structure including a lower electrode, a capacitor dielectric film, and an upper electrode sequentially stacked on the substrate,
wherein the lower electrode is connected to the capacitor contact,
wherein the lower electrode includes:
 a lower electrode film including a first metal element;
 a first doped oxide film disposed between the lower electrode film and the capacitor dielectric film, wherein the first doped oxide film includes a second metal element and an oxide of the first metal element, wherein the second metal element includes a metal element selected from at least one of Group 5 to Group 11 and Group 15 metal elements; and
 a first metal oxide film disposed between the lower electrode film and the first doped oxide film, wherein the first metal oxide film includes an oxide of the first metal element and is free of the second metal element,
wherein the upper electrode includes:
 an upper electrode film including the first metal element;
 a second doped oxide film disposed between the upper electrode film and the capacitor dielectric film, wherein the second doped oxide film includes a third metal element and an oxide of the first metal element, wherein the third metal element includes at least one of Group 5 to Group 11 and Group 15 metal elements; and
 a second metal oxide film disposed between the capacitor dielectric film and the second doped oxide film, wherein the second metal oxide film includes an oxide of the first metal element and is free of the third metal element, and
wherein the capacitor dielectric film includes a first zirconium oxide film, a second zirconium oxide film, and a hafnium oxide film disposed between the first zirconium oxide film and the second zirconium oxide film.

20. The semiconductor memory device of claim 19,
wherein the second metal element and the third metal element are identical with each other.

* * * * *